US012575176B2

(12) United States Patent
He et al.

(10) Patent No.: US 12,575,176 B2
(45) Date of Patent: Mar. 10, 2026

(54) SEMICONDUCTOR DEVICE AND METHOD OF FABRICATING A SEMICONDUCTOR DEVICE

(71) Applicant: Infineon Technologies Austria AG, Villach (AT)

(72) Inventors: Honghai He, Redondo Beach, CA (US); Robert Haase, San Pedro, CA (US); Harsh Naik, El Segundo, CA (US); Timothy Henson, Mount Shasta, CA (US); Ashita Mirchandani, Rolling Hills Estates, CA (US)

(73) Assignee: Infineon Technologies Austria AG, Villach (AT)

( * ) Notice: Subject to any disclaimer, the term of this patent is extended or adjusted under 35 U.S.C. 154(b) by 395 days.

(21) Appl. No.: 18/121,339

(22) Filed: Mar. 14, 2023

(65) Prior Publication Data

US 2023/0307454 A1 Sep. 28, 2023

(30) Foreign Application Priority Data

Mar. 24, 2022 (EP) ..................................... 22164148

(51) Int. Cl.
| | |
|---|---|
| *H10D 84/85* | (2025.01) |
| *H01L 21/265* | (2006.01) |
| *H03K 17/687* | (2006.01) |
| *H10D 30/01* | (2025.01) |
| *H10D 30/60* | (2025.01) |

(Continued)

(52) U.S. Cl.
CPC ..... *H10D 84/856* (2025.01); *H01L 21/26513* (2013.01); *H03K 17/6871* (2013.01); *H10D 30/022* (2025.01); *H10D 30/0289* (2025.01); *H10D 30/0297* (2025.01); *H10D 30/601*

(2025.01); *H10D 30/658* (2025.01); *H10D 30/668* (2025.01); *H10D 64/117* (2025.01);

(Continued)

(58) Field of Classification Search
None
See application file for complete search history.

(56) References Cited

U.S. PATENT DOCUMENTS 5,780,340 A * 7/1998 Gardner ............... H10D 30/608
257/E29.267
8,236,648 B2 * 8/2012 Hashitani ............. H10D 64/513
438/389

(Continued)

FOREIGN PATENT DOCUMENTS

WO 0172092 A1 9/2001

*Primary Examiner* — Cory W Eskridge
(74) *Attorney, Agent, or Firm* — Murphy, Bilak & Homiller, PLLC

(57) ABSTRACT

In an embodiment, a semiconductor device includes a vertical power FET for switching a load current, the power FET including a channel region of a first conductivity type and a first lateral FET and a second lateral FET providing an output stage of gate driver circuitry for driving the power FET. The first lateral FET includes a channel region of the first conductivity type and the second lateral FET includes a channel region of a second conductivity type opposing the first conductivity type. The power FET and the first and second lateral FETs are monolithically integrated into a semiconductor substrate of the first conductivity type and that has a first surface. A drain of the first lateral FET and a source of the second lateral FET are electrically coupled to a gate of the power FET.

16 Claims, 16 Drawing Sheets

(51) Int. Cl.
  *H10D 30/65* (2025.01)
  *H10D 30/66* (2025.01)
  *H10D 64/00* (2025.01)
  *H10D 84/01* (2025.01)
  *H10D 84/03* (2025.01)

(52) U.S. Cl.
  CPC ....... *H10D 84/017* (2025.01); *H10D 84/0172* (2025.01); *H10D 84/038* (2025.01)

(56) References Cited

U.S. PATENT DOCUMENTS

| | | | |
|---|---|---|---|
| 2003/0047792 A1* | 3/2003 | Disney | H10D 1/40 257/493 |
| 2006/0220140 A1 | 10/2006 | Robb et al. | |
| 2011/0241170 A1* | 10/2011 | Haeberlen | H10D 84/038 257/532 |
| 2012/0025874 A1* | 2/2012 | Saikaku | H10D 30/0295 257/330 |
| 2012/0175634 A1 | 7/2012 | Weis | |
| 2013/0334601 A1 | 12/2013 | Dong et al. | |
| 2014/0073102 A1 | 3/2014 | Toyoda et al. | |
| 2014/0091384 A1 | 4/2014 | Petruzzi et al. | |
| 2014/0374773 A1 | 12/2014 | Ryu et al. | |
| 2015/0380403 A1 | 12/2015 | Kotsar et al. | |
| 2015/0380543 A1* | 12/2015 | Zink | H10D 62/127 257/334 |
| 2016/0268423 A1* | 9/2016 | Koepp | H10D 84/839 |
| 2018/0350980 A1 | 12/2018 | Castro et al. | |
| 2021/0305063 A1 | 9/2021 | Or-Bach et al. | |
| 2023/0307450 A1* | 9/2023 | Naik | H10D 84/0172 |

* cited by examiner

SEMICONDUCTOR DEVICE AND METHOD OF FABRICATING A SEMICONDUCTOR DEVICE

BACKGROUND

Common transistor devices for power electronic applications include Si CoolMOS®, Si Power MOSFETs, and Si Insulated Gate Bipolar Transistors (IGBTs). Power transistors devices may be used in circuits for power control. For example, two power transistor devices may be coupled to form a half bridge circuit and driven by gate control circuitry to switch a load current.

WO 01/72092 A1 discloses a multichip module in which various components of a circuit are included within a single package. The circuit includes a first power MOSFET providing the high side switch of a half bridge circuit, a second power MOSFET providing the low side switch of the half bridge circuit and a gate driver for controlling switching of the high side switch and low side switch. The first power MOSFET, second power MOSFET and the gate driver are each provided as separate packaged components that are mounted within the module. It is, however, desirable to reduce the size of circuits for power control.

SUMMARY

According to the present disclosure, a semiconductor device is provided which comprises a vertical power FET (Field Effect Transistor), a first lateral FET and a second lateral FET. The vertical power FET (Field Effect Transistor) is configured to switch a load current. The first lateral FET and the second lateral FET provide an output stage of gate driver circuitry that is configured to drive the vertical power FET. The vertical power FET is configured to provide a channel region of a first conductivity type. The first lateral FET is configured to provide a channel region of the first conductivity type and the second lateral FET is configured to provide a channel region of a second conductivity type, that opposes the first conductivity type. The vertical power FET and the first and second lateral FETs are monolithically integrated into a semiconductor substrate of the first conductivity type. A drain of the first lateral FET and a source of the second lateral FET are electrically coupled to a gate of the vertical power FET.

According to the present disclosure, a semiconductor device is provided which comprises a vertical power FET (Field Effect Transistor), a first lateral FET and a second lateral FET. The vertical power FET comprises a channel region of a first conductivity type. The first lateral FET comprises a channel region of the first conductivity type and the second lateral FET comprises a channel region of a second conductivity type, that opposes the first conductivity type. The vertical power FET and the first and second lateral FETs are monolithically integrated into a semiconductor substrate of the first conductivity type. A drain of the first lateral FET and a source of the second lateral FET are electrically coupled to a gate of the vertical power FET.

The first conductivity type may be n-type and the second conductivity type p-type, or vice versa. For example, the first lateral FET may be a n-channel device and the second lateral FET be a p-channel device.

The vertical power FET has a vertical drift path that extends substantially perpendicularly to the first surface of the semiconductor substrate. In contrast, the lateral FETs have a drift path that extends substantially parallel to the first surface of the semiconductor substrate.

The vertical power FET may be a vertical MOSFET or MISFET with a charge compensation structure. The lateral FETs may be a lateral MOSFET or a lateral MISFET, for example a shallow trench recessed channel CMOS device or LDMOS device.

The first and second lateral FETs provide an output stage of the gate driver circuitry since the drain of the first lateral FET and the source of the second lateral FET are electrically coupled to the gate of the vertical power FET. The two lateral FETs are monolithically integrated in the semiconductor substrate along with the power vertical power FET which they are to control. This arrangement enables the physical size of the circuit to be reduced and the length of the electrical connections between the lateral FETs and the vertical power FET to be reduced, thus reducing losses and improve efficiency. The semiconductor device may also be useful for high current, e.g. 90A applications.

In some embodiments, a well of the second conductivity type is arranged in a first surface of the semiconductor substrate. The well is a portion of the semiconductor substrate that has dopants of the second conductivity type and that has a base and side walls which form a pn junction with the semiconductor substrate that includes dopants of the first conductivity type. The first lateral FET is formed in the well and comprises a gate electrode that is arranged in a first gate trench formed in the first surface. The gate electrode is electrically insulated from the well by a first insulating layer. The first insulating layer may line sidewalls and base of the first gate trench. The first gate trench may be referred to as a shallow trench. The first lateral FET also comprises a source region of the first conductivity type and a drain region of the first conductivity type that are arranged on opposing sides of the gate electrode and are arranged in the well. The source region and the drain region are, therefore, arranged on opposing sides of the first gate trench.

In some embodiments, opposing sidewalls of the first gate trench are formed by the source region and drain region, respectively.

In some embodiments, the first lateral FET further comprises a lightly doped drift region of the first conductivity type, the lightly doped drift region extending from the drain region under the first gate trench. In some embodiments, the lightly doped drift region further extends from the source region under the first gate trench. In some embodiments, the lightly doped drift region extends substantially horizontally and a more highly doped drain region and a more highly doped source region extend from the first surface into the well and have a depth from the first surface which is about the same as or at least the depth of the base of the first trench from the first surface. The lightly doped drift region can be considered to have two portions which extend towards one another, one from the drain region, the other from the source region, whereby the two portions are spaced apart from one another by a portion of the well.

In some embodiments, the lightly doped drift region for the drain region extends from the first surface of the substrate and adjoins the drain region and then extends under the drain region and the drain sided peripheral edge of the first gate trench.

In some embodiments, the lightly doped drift region is more lightly doped that the drain region. In some embodiments, the doping level of the drift region may be similar or the same as the drain region.

In some embodiments the first insulating layer, which lines the first gate trench and electrically insulates the gate electrode from the well, has a thickness on the base of the first gate trench that provides the gate insulation layer for the gate electrode. The first insulating layer has a thickness between the sidewall of the first gate trench on the drain side that is greater than its thickness on the base. In some embodiments, the sidewall of the first gate trench is formed by the drain region. The electrically insulating layer arranged between the first gate electrode and the drain-sided side wall provides a spacer and the thickness or width of this region of the electrically insulating layer may be adjusted to define the length of the drift region of the first lateral FET. The electrically insulating layer that is arranged between the first gate electrode and the drain-sided side wall and provides the spacer may also have two or more sublayers that may have differing compositions.

In some embodiments, the second lateral FET is formed in the semiconductor substrate and comprises a gate electrode arranged in a second gate trench that is formed in the first surface of the semiconductor substrate. The second gate trench may be referred to as a shallow trench. The second gate electrode is electrically insulated from the semiconductor substrate by a second insulating layer. The second insulating layer may line the sidewalls and base of the second gate trench. The second lateral FET further comprises a source region of the second conductivity type and a drain region of the second conductivity type that are arranged on opposing sides of the gate electrode. The source region and the drain region are positioned on opposing sides of the second gate trench and in the semiconductor substrate.

In some embodiments, opposing sidewalls of the second gate trench of formed by the source region and drain region, respectively.

In some embodiments, the second lateral FET further comprises a lightly doped drift region of the second conductivity type. The lightly doped drift region of the second lateral FET may extend from the drain region under the second trench. In some embodiments, the lightly doped drift region of the second conductivity type further extends from the source region under the second trench. The lightly doped drift region can be considered to have to portions which extend towards one another, one from the drain region and the other from the source region, whereby the two portions are spaced apart from one another by a portion of the semiconductor substrate.

In some embodiments, the lightly doped drift region for the drain region extends from the first surface of the substrate and adjoins the drain region and then extends under the drain region and the drain sided peripheral edge of the second gate trench.

In some embodiments, the lightly doped drift region is more lightly doped that the drain region. In some embodiments, the doping level of the drift region may be similar or the same as the drain region.

In some embodiments, the second insulating layer has a thickness on the base of the second trench that provides the gate insulation layer for the gate electrode. The second insulating layer has a thickness between the sidewall of the second trench on the drain side of the second trench that is greater than the thickness of the second insulating layer on the base.

The electrically insulating layer arranged between the second gate electrode and the drain-sided side wall provides a spacer and the thickness or width of this region of the electrically insulating layer may be adjusted to define the length of the drift region of the second lateral FET. The electrically insulating layer that is arranged between the second gate electrode and the drain-sided side wall and provides the spacer may also have two or more sublayers that may have differing compositions.

In some embodiments, the first gate trench of the first lateral FET has a base and sidewalls, whereby the sidewalls extend substantially perpendicular to the first surface. In other embodiments, the side walls extend at an inclined angle to the first surface to form a tapered trench, in which the base of the trench has a smaller area than the open end of the trench at the first surface. In some embodiments, an edge formed between the base and the sidewalls of the trench is rounded. The sidewalls may be inclined to the first surface or substantially perpendicular to the first surface.

In some embodiments, the second gate trench of the second lateral FET has a base and sidewalls, whereby the sidewalls extend substantially perpendicular to the first surface. In other embodiments, the sidewalls extend as an inclined angle to the first surface to form a tapered trench, in which the base of the trench has a smaller area than the open end of the trench at the first surface. In some embodiments, and edge formed between the base and the sidewalls of the trench is rounded. The sidewalls may be inclined to the first surface or substantially perpendicular to the first surface.

In some embodiments, the vertical power FET comprises a plurality of third trenches extending into the semiconductor substrate from the first surface. The distance of the base of the third trenches of the vertical power FET from the first surface is greater than the distance of the base of the first and second gate trenches of the first and second lateral FETS. Mesas are formed between the third trenches. The semiconductor substrate provides the drift region of the vertical FET. Each third trench comprises a field plate that is electrically insulated from the semiconductor substrate. The vertical power FET further comprises a drain region arranged at a second surface of the semiconductor substrate that opposes the first surface, a body region of the second conductivity type that is arranged on the drift region and a source region of the first conductivity type that is arranged on the body region. The mesas include the drift region, body region and source region.

In some embodiments, each of the plurality of third trenches further comprises a gate electrode that is arranged above and that is electrically insulated from the field plate positioned in that trench. In some embodiments, the vertical power FET has a different arrangement of the gate electrode and further comprises a plurality of gate trenches, each comprising a gate electrode. One gate trench is arranged between adjacent ones of the plurality of third trenches which include only a field plate. The gate trenches are arranged in the mesas and have a depth that is less than the depth of the third trenches with the field plates.

In some embodiments, the third trenches are columnar or needle shape. In these embodiments the individual field plates also have a columnar or needle shape. The columnar trenches and, therefore, the field plates, may be arranged in a regular array, for example of rows and columns or in staggered rows. In some embodiments, the third trenches are columnar and the gate trenches are elongate and strip-like. In some embodiments, the third trenches are elongate and have a stripe-like structure. The filed plates and the gate electrodes also have an elongate strip-like structure.

According to the present disclosure, a method for forming a vertical power FET for switching a load current, a first lateral FET and a second lateral FET in a common semiconductor substrate is provided. The method comprises providing a semiconductor substrate of the first conductivity type. The semiconductor substrate comprises a first surface, a plurality of trenches for a vertical power FET formed in the first surface, each trench comprising a field plate that is electrically insulated from the semiconductor substrate. The semiconductor substrate further comprises a first predefined area region for a first lateral FET having a channel region of the first conductivity type and a second predefined region for lateral second lateral FET having a channel region of the second conductivity type that opposes the first conductivity type.

The method comprises forming a well of the second conductivity type in the first surface of the semiconductor substrate in the first predefined region. A well of the second conductivity type is not formed in the second predefined region or in the third predefined region of the semiconductor substrate comprising the trenches for the vertical power FET.

The method continues by forming a first gate trench in the first surface of the semiconductor substrate for a first gate electrode in the first predetermined region and a second gate trench in the first surface of the semiconductor substrate for a second gate electrode in the second predefined region. The first gate trench and second gate trench may be formed in the first and second predefined regions, respectively, using the same process steps. A gate insulating layer is formed which covers the sidewalls and base of the first and second gate trenches, the first surface of the semiconductor substrate and the upper portion of the plurality of trenches for the vertical power FET. Conductive material is inserted into the first and second gate trenches and also into the plurality of trenches for the vertical power FET and a third gate electrode is formed in each of the plurality of trenches.

Conductive material is removed from the first and second gate trenches in regions adjacent the sidewalls and also from peripheral regions of the base of each of the first and second gate trenches. The gate insulating layer positioned on the sidewalls and in peripheral regions of the base is exposed. The remaining portion of the conductive material in the first gate trench forms the first gate electrode having a predetermined length. Similarly, a second gate electrode having a predetermined length is formed from the conductive material remaining and the second gate trench. In the second predefined area, dopants of the second conductivity type are implanted into the sidewalls and peripheral regions of the base of the second gate trench. In the first predefined area, dopants of the first conductivity type are implanted into the sidewalls and into peripheral regions of the base of the first gate trench. Insulating material is then formed in the first and second gate trenches and may fill the first and second gate trenches covering the first and second gate electrodes and is also formed on the third gate electrodes arranged in the plurality of trenches.

In this method, the same process steps may be used to form the gate electrode of the vertical power FET as well as for the two lateral FETs and also the insulating material in the respective gate trenches of the vertical power FET as well as for the two lateral FETs.

In some embodiments, the method further comprises implanting dopants of the second conductivity type into the first surface of the semiconductor substrate to form a body region of the power FET, implanting dopants of the first conductivity type into the first surface of the semiconductor substrate and into the well of the second conductivity type in the first predefined region to form source and drain regions of the first lateral FET and a source region on the body region for the vertical power FET and implanting dopants of the second conductivity type into the first surface of the semiconductor substrate in the second predefined region to form source and drain regions of the second lateral FET.

In some embodiments, a third insulating layer is formed on the first surface and openings are formed in the third insulating layer which expose the underlying structure to which a contact is to be made by inserting conductive material into the opening.

An opening to the first gate electrode is formed in the first gate trench, an opening is formed to the source region and an opening is formed to drain region of the first lateral FET. An opening is formed to the second gate electrode in the second gate trench, an opening is formed to the source region and an opening is formed to drain region of the second lateral FET. An opening is also formed to the third gate electrodes in the plurality of trenches and an opening is formed to the source region of the vertical power FET. Conductive material is inserted into these openings to form the contact to the underlying structure and a planarising process carried out, for example by chemical mechanical polishing, to form a planarized surface comprising contacts formed of the conductive material arranged in the openings and the third insulating layer. A metallization structure may be formed on the planarized surface.

The metallization structure may include a plurality of electrically insulating and electrically conductive layers. The metallization structure can be patterned so as to provide electrical connections between the drain contacts of the first and second lateral FETS and the gate of the vertical power FET.

Typically, the first and second lateral FET each comprise a plurality of transistor cells, each including a source region, a drain region and a gate trench with the gate electrode and each having substantially the same structure. Each of the source region, drain region, gate trench and gate electrode may have an elongate stripe-like form and extend substantially parallel to one another, whereby the source and drain region can be common to two adjoining cells so that an order of source region, gate electrode, drain region, gate electrode source region and so on is formed. The first lateral FET according to any one of the embodiments described herein may also represent one of the transistor cells of the plurality of transistor cells of the first lateral FET. Similarly, the second lateral FET according to any one of the embodiments described herein may also represent one of the transistor cells of a plurality of the transistor cells of the second lateral FET.

The vertical power FET typically also comprises a plurality of transistor cells, each including a mesa with a source region, body region, drift region and a drain region and a third trench with a field plate and a gate electrode and each having substantially the same structure.

The metallization structure may also provide busses for electrically connecting transistor cells of the first and second lateral FETS and of the vertical power FET. For example, a first source bus electrically connects the source regions of the first lateral FET, a first drain bus electrically connects the drain regions of the first lateral FET and a first gate bus electrically connects the first gate electrodes of the first lateral FET to one another. A second source bus electrically connects the source regions of the second lateral FET, a second drain bus electrically connects the drain regions of the second lateral FET and a second gate bus electrically connects the gate electrodes of the second lateral FET to one another. A third source bus electrically connects the source regions and field plates of the vertical power FET and a third gate bus electrically connects the gate electrodes of the vertical power FET to one another. The vertical power FET includes a single drain region arranged at the second surface of the semiconductor substrate which provides a common drain region for all of the transistor cells. A drain pad may be directly arranged on the drain region at the second surface.

In some embodiments, the removing the conductive material from the first and second gate trenches comprises applying a mask onto the first surface that covers the third gate electrodes in the plurality of trenches and that covers designated source and drain regions on opposing sides of the first and second gate trenches and a designated gate electrode region of the conductive material in the first and second gate trenches. The regions of the conductive material exposed by the mask are removed from the first and second gate trenches, for example by etching such as wet chemical etching.

In some embodiments, the etching process is carried out such that the first gate electrode has inclined side walls, wherein a base of the first gate electrode that is formed on the gate insulating layer has a larger area than a top of the first gate electrode and the second gate electrode has inclined side walls, wherein a base of the second gate electrode that is formed on the gate insulating layer has a larger area than a top of the second gate electrode.

After removal of the conductive material and forming the first and second gate electrodes, the first and second gate trenches may be filled with insulating material which may also cover the first and second gate electrodes.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
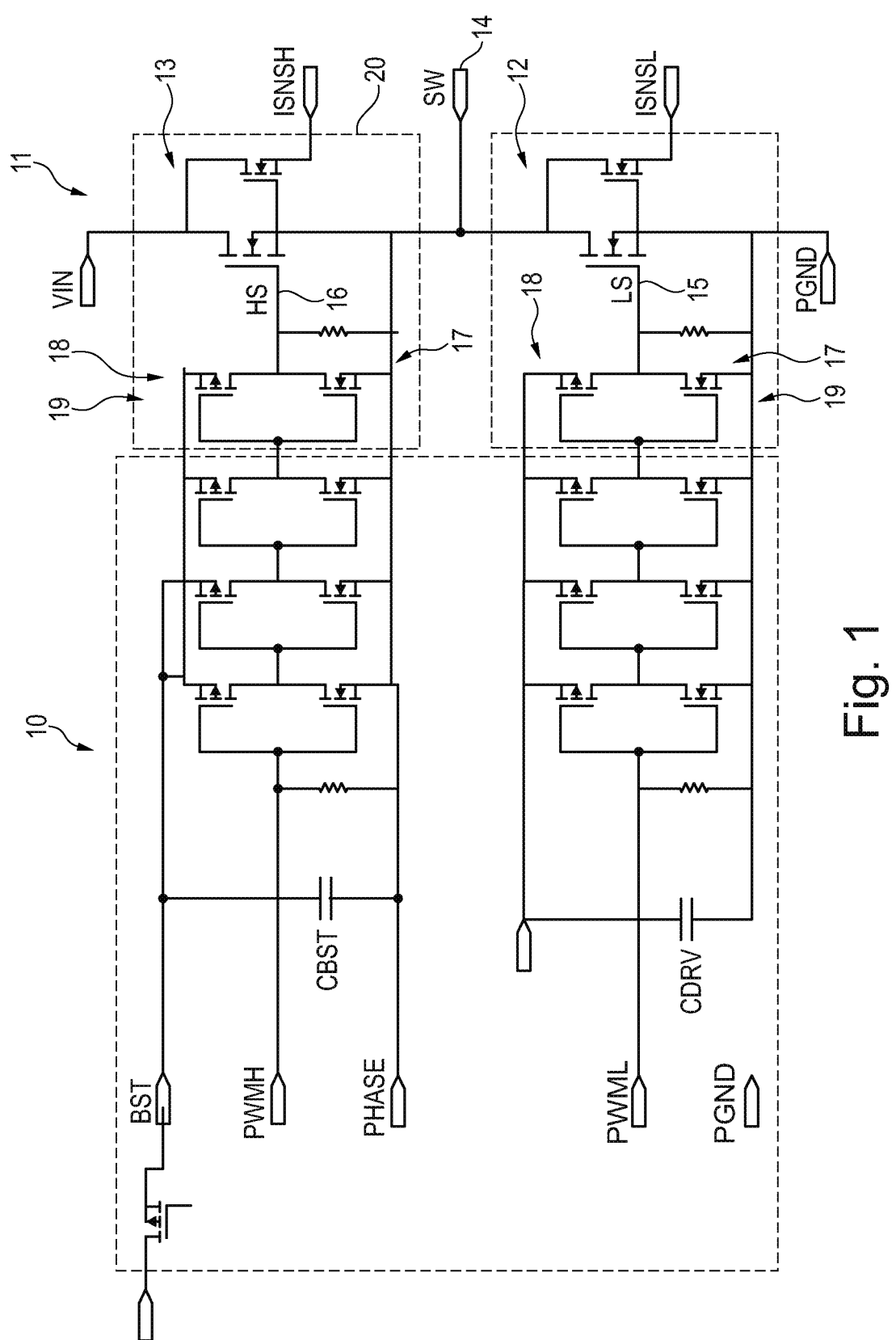
FIG. 1 illustrates a diagram of a circuit including a half-bridge circuit and a gate driver circuit for switching the half-bridge circuit.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The figures illustrate relative doping concentrations by indicating "−" or "+" next to the doping type "n" or "p". For example, "n$^{-}$" means a doping concentration which is lower than the doping concentration of an "n"-doping region while an "n$^{+}$"-doping region has a higher doping concentration than an "n"-doping region. Doping regions of the same relative doping concentration do not necessarily have the same absolute doping concentration. For example, two different "n"-doping regions may have the same or different absolute doping concentrations.

According to the present disclosure, a semiconductor device is provided that includes a vertical power FET and two lateral FETs monolithically integrated into a semiconductor substrate. The lateral FETs are electrically coupled to the vertical power FET so that the lateral FETs can form part of a gate driver circuit for driving the vertical power FET. The lateral FETs may provide part of the output stage of the gate driver circuit.

The semiconductor device may be used in DCDC applications, where integrating driver devices in a power MOS- FET can result in better performance and higher frequency. Bringing drivers into the die of the power switch can add on efficiency gains from power MOSFET Figure-of-Merit (FOM) improvement. The semiconductor device may be used to provide a high side switch or a low side switch of a half-bridge of full-bridge circuit which has an integrated output stage of a gate driver circuit provided by the two lateral FETs.

Driver/control devices with lateral channels are included in a power device with a vertical channel into a single chip. By integrating the lateral FET devices into the power FET device fabrication process flows, die front side interconnects are enabled and die area is saved. This semiconductor device can be used to optimize high frequency performance and can be used in multiphase modules.

FIG. 1 illustrates a diagram of a circuit that includes a gate driver circuit 10 for driving a half-bridge circuit 11. The half-bridge circuit 11 comprises a low side switch 12 and a high side switch 13 which are coupled at an output node 14 for switching a load current. The low side switch 12 and the high side switch 13 are each provided by a transistor device which has a gate 15, 16, which is driven by gate driver circuit 10. The gate driver circuit 10 comprises a plurality of pairs of transistor devices 17, 18, each of which may be a lateral FET, each pair forming a stage.

In order to provide such a circuit, the gate driver circuit 10 may be provided in the form of a first packaged component and each of the low side switch 12 and the high side switch 13 may be provided in a separate package.

However, according to the present disclosure, the vertical power FET, which may provide the low side switch 12 or the high side switch 13 of the half bridge circuit 11, is monolithically integrated into a semiconductor substrate, which is typically a semiconductor chip or die, with both of the lateral FETs 17, 18 of the output stage 19 of the gate driver circuit 10 which are electrically connected to the gate of the vertical power MOSFET which they are to drive. The circuit integrated into a single semiconductor substrate is indicated in FIG. 1 by the dashed line 20.

Figure 2:
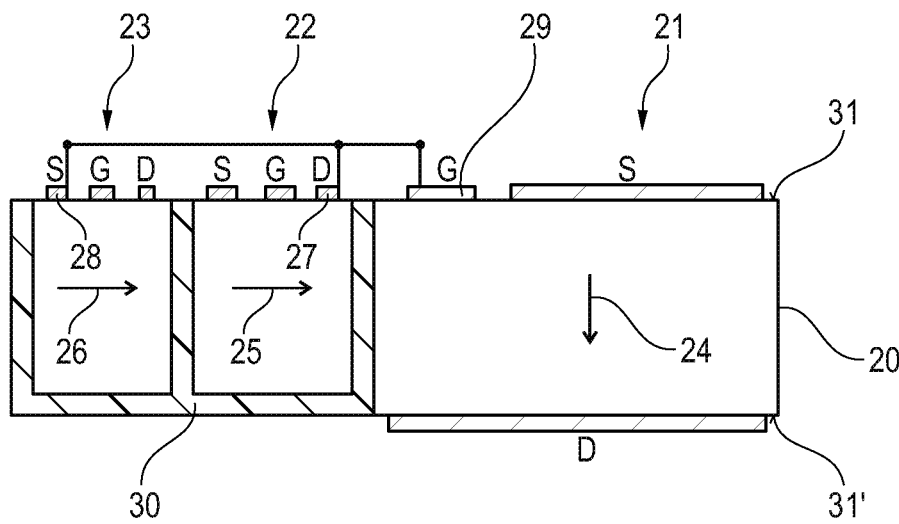
FIG. 2 illustrates a schematic diagram of a semiconductor device including a vertical power FET and two lateral FETs that are monolithically integrated in a common semiconductor substrate.

FIG. 2 illustrates a schematic diagram of a semiconductor device 1000 including a vertical power FET 21, a first lateral FET 22 and a second lateral FET 23 that are monolithically integrated into a semiconductor substrate 20 which may also be called a semiconductor chip or die. The first lateral FET 22 and the second lateral FET 23 provide an output stage of gate driver circuitry for driving the vertical power FET 21. The vertical power FET 21, the first lateral FET 22 and the second lateral FET 23 are arranged laterally adjacent one another in the semiconductor substrate 20 and may each be formed in a predefined area of the substrate 20 that is electrically insulated from the other devices.

The vertical power FET 21 is suitable for switching a load current and has a channel region, indicated schematically in the drawing by the arrow 24, of a first conductivity type. The vertical power FET 21 may be used as the high side switch or the low side switch in a half-bridge circuit, for example as the high side switch 13 or low side switch 12 of the half bridge circuit 11 shown in FIG. 1.

The first lateral FET 22 has a channel region of the first conductivity type, as is indicated schematically in FIG. 2 by the arrow 25, and the second lateral FET 23 has a channel region of a second conductivity type that opposes the first conductivity type, as is indicated schematically in FIG. 2 by the arrow 26.

A drain 27 of the first lateral FET 22 and a source 28 of the second lateral FET 23 are electrically coupled to a gate 29 of the vertical power FET 21 so as to enable the first and second lateral FETs 22, 23 to drive the vertical FET 21. The first lateral FET 22 may be used as the transistor 17 and the second lateral FET 23 may be used as the transistor 18 of the output stage 19 of the driver circuit 10 shown in FIG. 1. The semiconductor device 20 can be used to provide a portion of the circuit of FIG. 1 as indicated in FIG. 1 by the box 20.

In some embodiments, the first conductivity type is n type and the second conductivity type is p type. In other embodiments, the first conductivity type is p type and the second conductivity type is n type.

The semiconductor substrate 20 includes a first surface 31 and a second surface 31' opposing the first surface 31. The semiconductor substrate 20 is a semiconductor die or chip which may be formed of monocrystalline silicon or comprises an epitaxial layer of silicon grown on a monocrystalline silicon substrate.

The first lateral FET 22, the second lateral FET 23 and the vertical power FET 21 may be electrically isolated from one another by means of an isolation trench or isolation ring 30 that is filled with an insulating material, or by an implanted region, i.e. a crystallographically damaged region.

Figure 3:
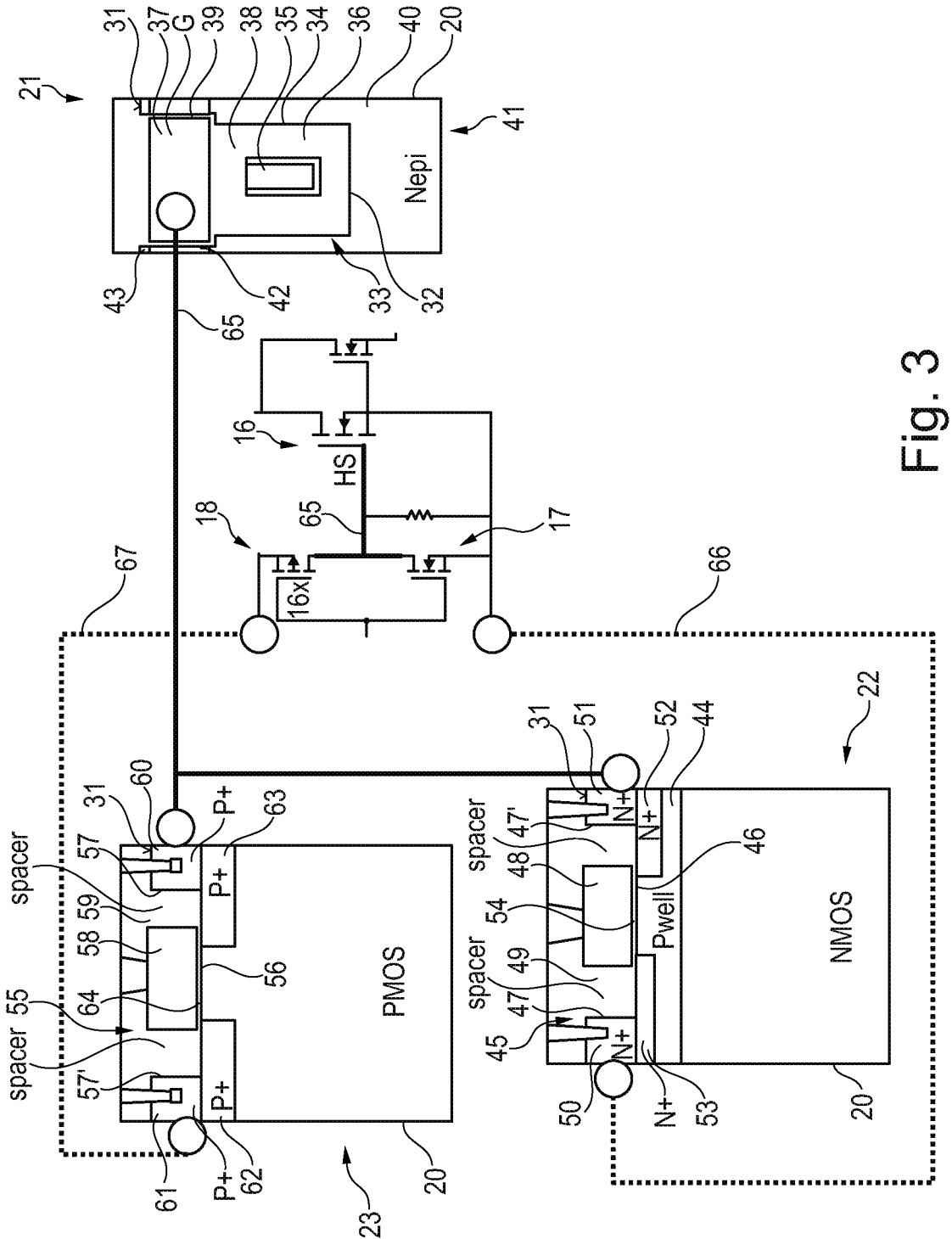
FIG. 3 illustrates a diagram illustrating the electrical connections between the lateral FET and the vertical power FET.

FIG. 3 illustrates a further cross-sectional view of the semiconductor substrate 20 in which the structure of the vertical power FET 21 and the first and second lateral FETs 22, 23 is shown in more detail. FIG. 3 also schematically illustrates the electrical connections between the first and second lateral FETs 22, 23 and the vertical power FET 21.

The vertical power FET comprises a plurality of trenches 33, of which only one can be seen in FIG. 3, which extend into the semiconductor substrate 20 from the first surface 31. The trenches 33 have sidewalls 34 and a base 32 and may have an elongate strip-like form in plan view or may have a columnar or needle sharp like shape in plan view. The trenches 33 each comprise a field plate 35 which is electrically insulated from the semiconductor substrate 20 by an electrically insulating layer 36 which lines the base 32 and sidewalls 34 of the trench 33. In this embodiment, the trenches 33 also include a gate electrode 37 arranged on the upper portion of the trench which is electrically insulated from the field plate 35 by an intervening intermediate electrically insulating layer 38. In the upper portion of the trench 33, a gate insulating layer 39 is arranged between the gate electrode 37 and the upper portion of the sidewalls 34 trench.

The semiconductor substrate 20 comprises the first conductivity type, e.g. n-type, and provides the drift region 40 of the vertical power FET 21. Mesas 41 are formed between the sidewalls of adjacent ones of the trenches 33 and include the drift region 40, a body region 42 of the second conductivity type, e.g. p-type if the drift region is n-type, arranged on the drift region 40 and a source region 43 of the first conductivity type arranged on or in the body region 42.

The first lateral FET 22, which has a channel region of the first conductivity type, is formed in a well 44 of the second conductivity type formed in the first surface 31 the semiconductor substrate 20. The first lateral FET 22 includes a first gate trench 45 which extends into the semiconductor substrate 20 from the first surface 31 and which includes a base 46 and sidewalls 47. The gate electrode 48 is arranged in the first gate trench 45 and is electrically insulating from the well 44 by an electrically insulating layer 49. The first lateral FET 22 further includes a source region 50 of the first conductivity type and a drain region 51 of the first conductivity type which are arranged on opposing sides of the gate trench 45 and on opposing sides of the gate electrode 48. The source region 50 and the drain region 51 are formed within the well 44.

The first lateral FET 22 further includes a lightly doped drift region 52 of the first conductivity type that extends from the drain region 51 under the first gate trench 45 and slightly vertically overlaps the drain sided edge of the gate electrode 48. A lightly doped region 53 also extends from the source region 50 under the first gate trench 45 towards the drain region 51 and has a distal end which overlaps with the source sided end of the gate electrode 48. The two lightly doped regions 52, 53 of the first conductivity type are spaced apart by a portion of the well 44 of the second conductivity type. The lightly doped drift regions 52, 53 may form opposing peripheral regions of the base 46 of the first gate trench 45. The lightly doped drift regions 52, 53 are arranged within the well 44. The lateral spacing between the doped regions 52, 53 provides the channel length of the first lateral FET 22.

The first electrically insulating layer 49 arranged in the first gate trench 45 has a thickness on the base 46 of the trench 45 that provides the gate insulation layer 54 for the first gate electrode 48. The first insulating layer 49 has a thickness between the drain sided sidewall 47' of the first gate trench 45 and the gate electrode 48 which is greater than the thickness on the base 46. The thickness of the first insulating layer 49 between the source sided end of the gate electrode 48 and the source sided sidewall 47 of the first gate trench 45 is less than the thickness between the gate electrode and the opposing sidewall 47' so that the gate electrode 48 is positioned laterally closer to the source region 50 than to the drain region 51. In some embodiments, the source region 50 and the drain region 51 form the opposing sidewalls 47, 47' of the first gate trench 45.

The second lateral FET 23 has a channel of the second conductivity type, e.g. p-type if the first conductivity type is n-type, and is formed in the semiconductor substrate 20. The second lateral FET 23 comprises a gate trench 55 which extends into the semiconductor substrate 20 from the first surface 31 and which comprises a base 56 and sidewalls 57. A second gate electrode 58 is arranged in the second gate trench 55 and is electrically insulated from the semiconductor substrate 20 by a second insulating layer 59. The second lateral FET 23 comprises a source region 60 of the second conductivity type conductivity type and a drain region 61 of the second conductivity type that are arranged on opposing sides of the gate electrode 58 and the second gate trench 55.

The second lateral FET 23 further includes a lightly doped drift region 62 of the second conductivity type that extends from the drain region 61 under the first gate trench 55 and slightly vertically overlaps the drain sided edge of the gate electrode 58. A lightly doped region 63 also extends from the source region 50 under the second gate trench 55 towards the drain region and has a distal end which overlaps with the source sided end of the gate electrode 61. The two lightly doped regions 62, 63 of the second conductivity type are spaced apart by a portion of the semiconductor substrate 20 of the first conductivity type. The lightly doped drift regions 62, 63 may form opposing peripheral regions of the base 56 of the second gate trench 55. The lateral spacing between the doped regions 62, 63 provides the channel length of the second lateral FET 23.

The second electrically insulating layer 59 arranged in the gate trench has a thickness on the base of the trench 55 that provides the gate insulation layer 64 for the second gate electrode 58. The second insulating layer 59 has a thickness between the sidewall of the drain sided sidewall 57' of the second gate trench 55 and the second gate electrode 58 which is greater than the thickness on the base. The thickness of the second insulating layer 59 between the source sided end of the gate electrode 58 and the source sided sidewall 57 of the second gate trench 55 is less than the thickness between the gate electrode 58 and the opposing sidewall 57' so that the gate electrode 58 is positioned laterally nearer to the source region 60 than to the drain region 61. In some embodiments, the source region 60 and the drain region 61 form the opposing sidewalls 57, 57' of the second gate trench 55.

As is illustrated schematically in FIG. 3 by the line 65, the drain region 51 of the first lateral FET 22 is electrically coupled to the gate electrode 37 of the vertical power FET 21. The source region 60 of the second lateral FET 23 is electrically coupled to the drain region 51 of the first lateral FET 22 and to the gate electrode 37 of the vertical power FET 21 as indicated schematically in FIG. 3 by the line 65. The source region 50 of the first lateral FET 22, as indicated schematically in FIG. 3 by the line 66, is electrically connected to either phase node Phase or the ground node PGND depending on whether the vertical power FET 21 provides the low side switch 12 or the high side switch 13 of the half bridge circuit. The drain region 61 of the second lateral FET 23 is electrically connected the voltage line V of the gate driver circuit 10, as indicated schematically in FIG. 3 by the line 67 that is shown in FIG. 1.

Figure 4A:
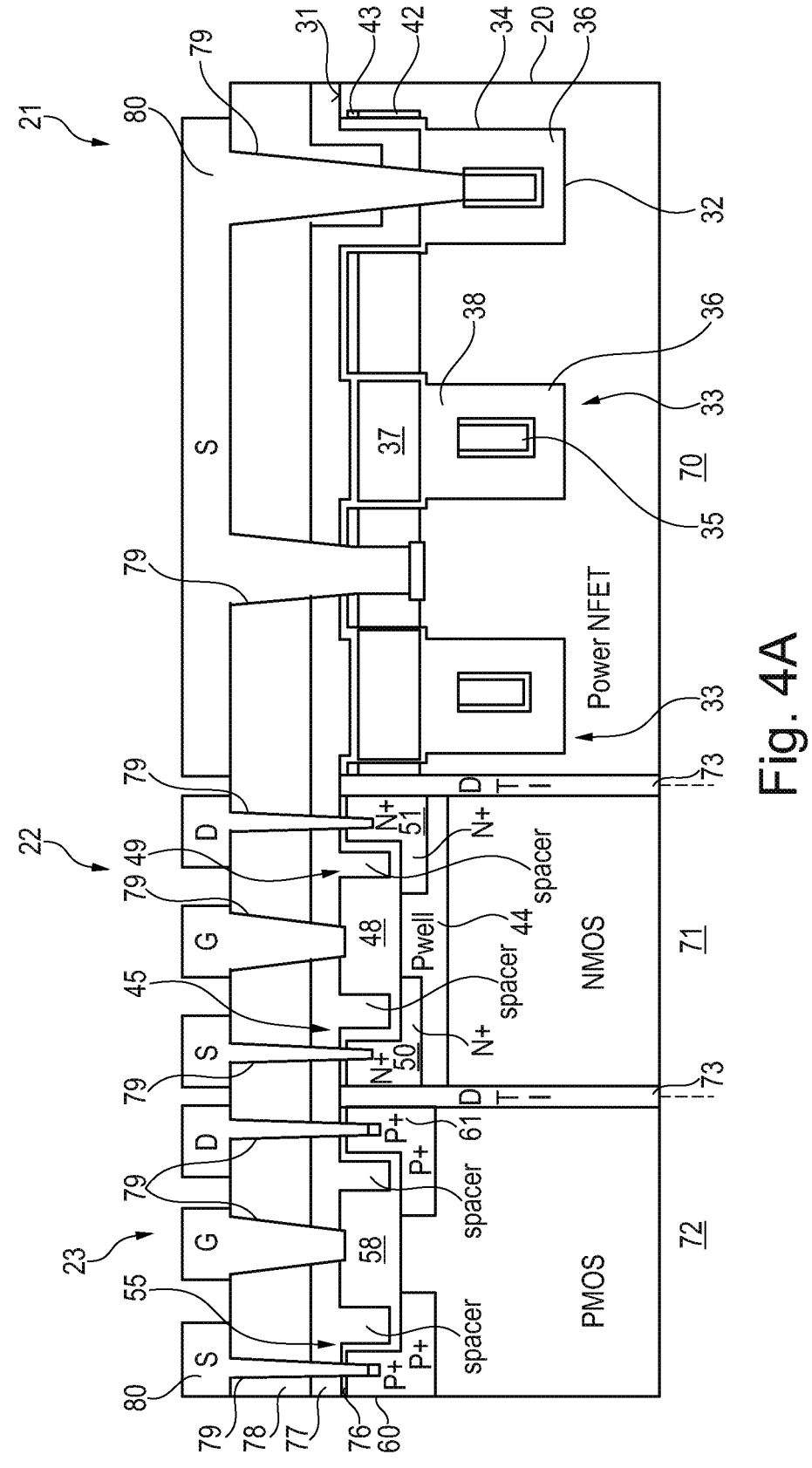
FIGS. 4A to 4C illustrate cross-sectional views of the semiconductor substrate including a vertical power FET and two lateral FETs according to various embodiments.
Figure 4B:
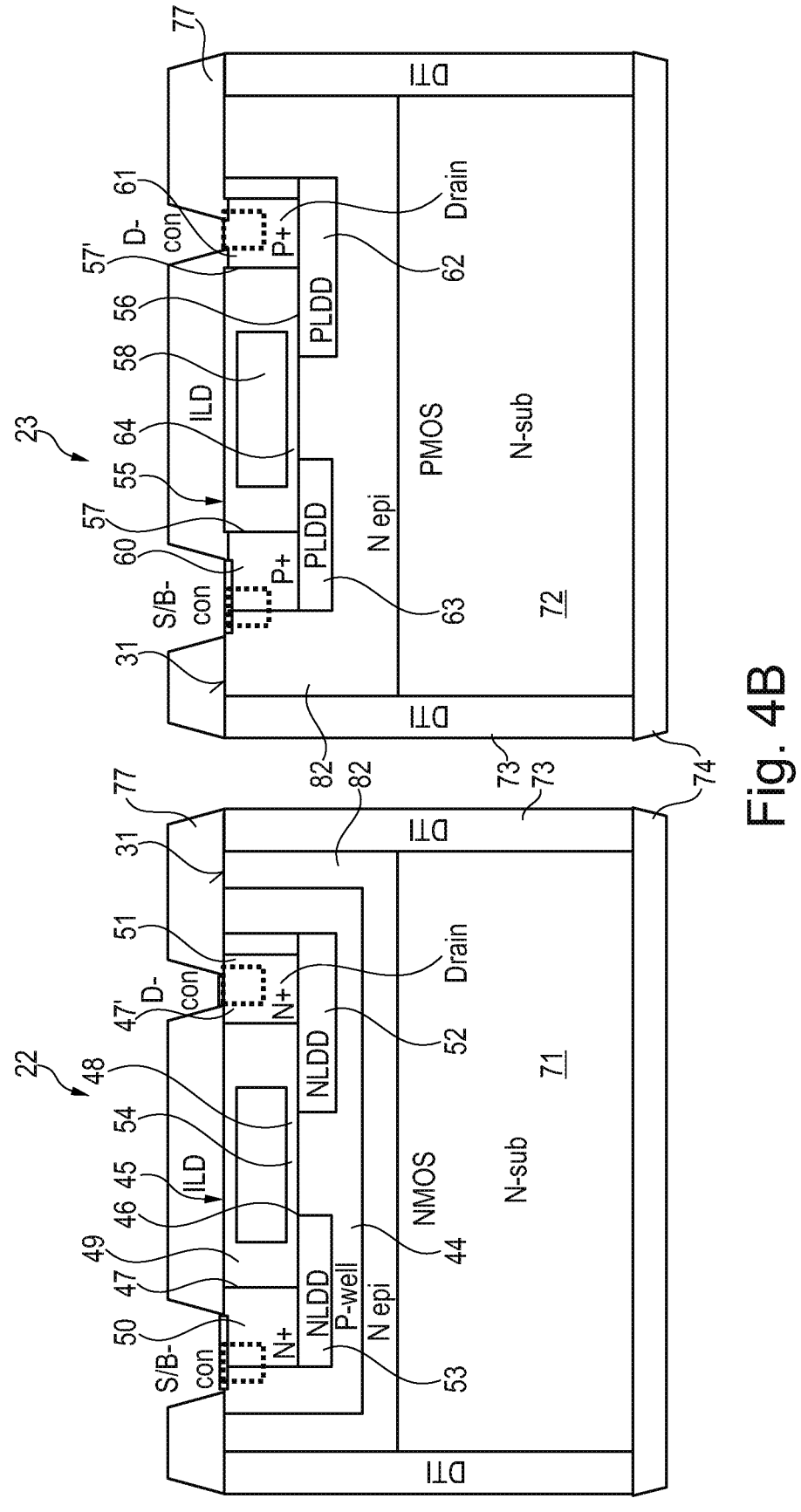
Figure 4C:
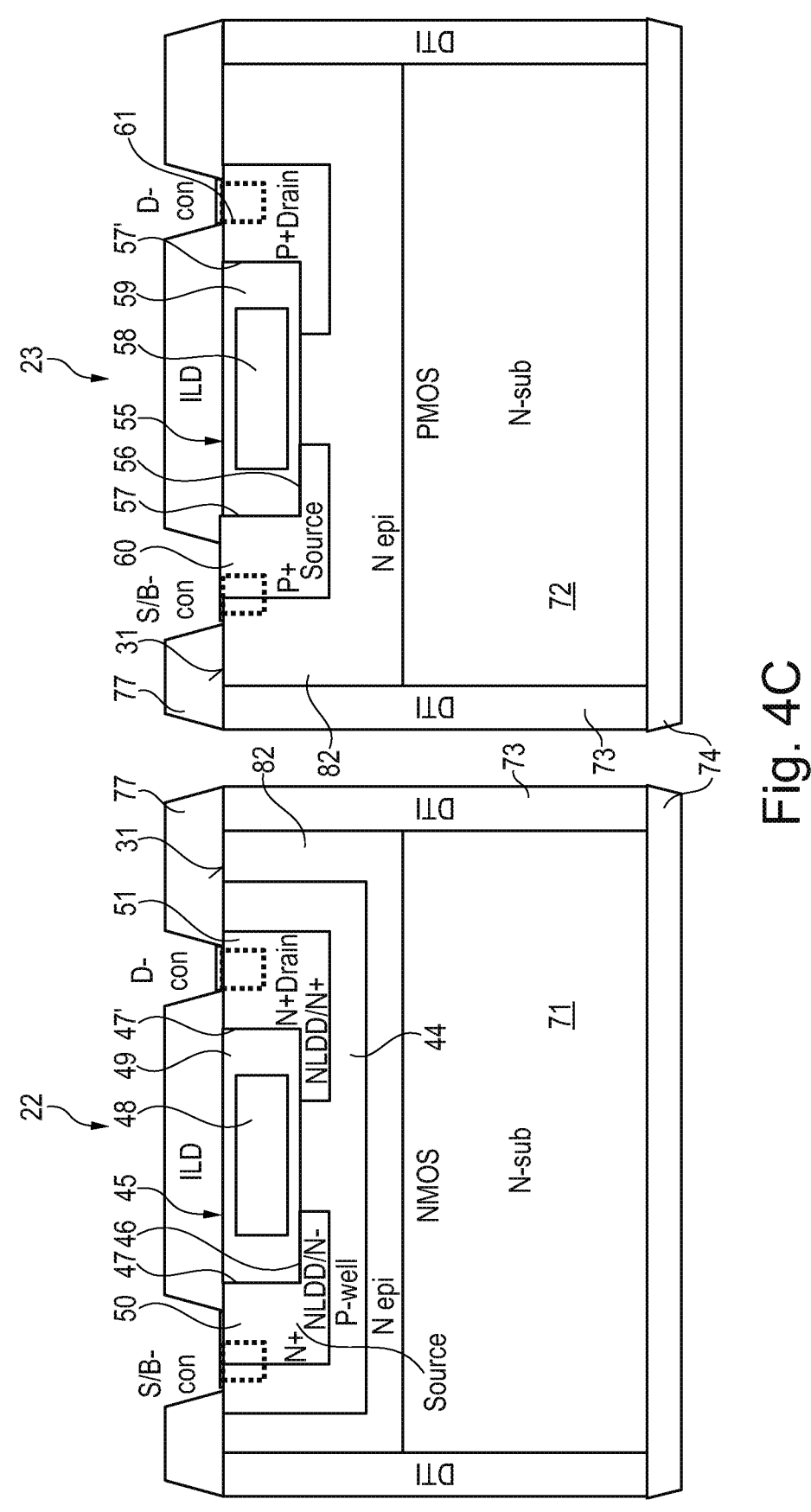

FIGS. 4A to 4C illustrate schematic cross-sectional views of the semiconductor substrate 20 in which the vertical power FET 21 and the first and second lateral FETs 22, 23 according to other embodiments are monolithically integrated.

As can be seen in FIG. 4A, the vertical power FET 21 and first and second lateral FETs 22, 23 are arranged in a common semiconductor substrate 20. The first lateral FET 22 is positioned in a first area 71 of the semiconductor substrate and the second lateral FET 23 is arranged in a second area 72 of the semiconductor substrate 20 laterally adjacent to a third area 70 of the semiconductor substrate 20 in which the vertical power FET 21 is positioned. The first area 71 and the second area 72 are electrically isolated from the semiconductor substrate by insulating regions 73. The insulating regions may comprise a trench extending into the semiconductor substrate 20 from the first surface 31 which is filled with dielectric material or may comprise an implanted region. As can be seen in the cross-sectional views of FIGS. 4B and 4C, the lower surface of the areas 71, 72 is electrically insulated from the underlying portion of the semiconductor substrate 20 by an oxide layer 74. The vertical power FET 21, the first lateral FET 22 and the second lateral FET 23 may have the structure of the respective device illustrated in FIG. 3.

In the cross-sectional view of FIG. 4A, the metallization structure 75 which is formed on the first surface 31 is illustrated. The metallization structure 75 extends throughout the three areas 70, 71, 72 such that the electrical contacts to the source, drain and gate of each of the transistor devices 21, 22, 23 as well as to the field plate 35 of the vertical power FET 21 can be formed using the same processing steps.

In some embodiments, the first and second insulation layers 49, 59 that fill the first and second gate electrode trenches 45, 55 have a multilayer structure. The structure of the first and second insulating layers 49, 59 of the first and second gate trenches 45, 55 according to an embodiment is illustrated in the cross-sectional view of FIG. 4A.

A first sublayer 76 of electrically insulating material is formed which extends over the first surface 28 and which also extends over the sidewalls 57 and base 56 of the second gate trench 55 and also over the gate electrode 58 of the second lateral FET 23. Similarly, the first electrically insulating sublayer 76 extends over the first surface, sidewalls 45 and base 46 of the first gate electrode trench 45 and over the surface of the first gate electrode 48 of the first lateral FET 22. The first electrically insulating sublayer 76 also extends over the first surface 28 and the gate electrode 37 positioned in the upper portion of the trenches 33 of the vertical power FET 21. The first sublayer 76 forms the gate insulating layer 54, 64, since the respective gate electrode 48, 58 is arranged on the first sublayer 76.

The first and second insulating layers 49, 59 also each include a second sublayer 77 which is arranged on the first sublayer 76 and which fills the remaining portions of the first and second gate trenches 45, 55 of the first and second lateral FETs 22, 23. The second electrically insulating sublayer 77 also extends over the front surface 31 in both the first and second areas 71, 72 and also over the front surface 31 in the third area 70 in which the vertical power FET is positioned. A third electrically insulating sublayer 78 is arranged on the second electrically insulating sublayer 77 and extends over the entire front surface 28.

Openings 79 are formed which extend through the three electrically insulating sublayers 76, 77, 78. An opening 79 is positioned above and exposes a portion of each of the source region 60, the gate electrode 58 and the drain region 61 of the second lateral FET 23, the source region 50, the gate electrode 48 and the drain region 51 of the first lateral FET 22 and the mesas 40 and at least one of the trenches 33 such that the opening 79 extends to the field plate 35 arranged in the bottom of the trench 33.

These openings 79 are filled with conductive material 80 in order to form individual contacts to the underlying structure. The electrically conductive layer 80 may consist of sublayers and may be structured so as to provide the electrical connections between the drain and source of the first and second lateral FETs 22, 23 and the gate of the vertical power FET 21.

The contact to the gate 37 of the vertical power FET 21 cannot be seen in the cross-sectional view of FIG. 4A and is positioned in a plane not visible in the cross-sectional view of FIG. 4A. The contact to the gate 37 is also formed by opening 79 which extends through the first, second and third electrically insulating sublayers 76, 77, 78 which is filled with conductive material 80.

In some embodiments, after the opening 79 is formed, dopants of the second conductivity type are implanted into the mesa 40 in order to form a contact region 81 at the base of the opening 79 which is electrically connected to the body region 42 of the vertical power FET 21. In some embodiments, the electrically insulating layer 34 which lines the trenches 33 of the vertical power FET 21 also includes a further sublayer which is arranged between the conductive material, for example, polysilicon of the field plate 35 and the electrically insulating layer 36.

The electrically insulating material 33 lining the third trenches 33 may be formed of silicon oxide which may be formed by oxidation or using a TEOS process. In some embodiments, the first electrically insulating sublayer 76 is formed of silicon oxide, the second electrically insulating sublayer 77 is formed of USG (undoped silicate glass) and the third electrically insulating layer 78 is formed of the BSG (boron silicate glass). In some embodiments, the contacts 80 comprise tungsten. In some embodiments, the electrically conductive material 80 has two or more sublayers. For example, the conductive material 80 may have a structure of titanium, titanium nitride, tungsten.

In contrast to the embodiment illustrated in FIG. 3, in the embodiment illustrated in FIG. 4A the source region 50 and drain region 51 of the first lateral FET 22 each extend under the peripheral edge of the opposing sides 47, 47' of the gate trench 45 so that the lightly doped regions 52, 53 are in fact heavily doped with the first conductivity type. Similarly, the source region 60 and drain region 61 of the first lateral FET 23 each extend under the peripheral edge of the opposing sides 57, 57' of the gate trench 55 so that the lightly doped regions 62, 63 are in fact heavily doped with the second conductivity type.

FIG. 4B illustrates a cross-sectional view according to another embodiment of the first and second areas 71, 72 of the semiconductor substrate 70 in which the first and second lateral FETs 22, 23, respectively, are positioned. The vertical power FET cannot be seen in this view but may have the structure illustrated in FIGS. 3 and 4A.

In this embodiment, the semiconductor substrate 20 includes an epitaxial layer 82 of the first conductivity type which is positioned on the semiconductor substrate 20 of the first conductivity type. The epitaxial layer 82 may extend throughout the semiconductor substrate 20 or may be formed in discrete areas of the semiconductor substrate 20 for example in the first and second areas 71, 72. Also illustrated in FIG. 4B is the larger spacing between the drain sided edge of the gate electrode 48 and the drain region 51 compared to the distance and thickness of the electrically insulating layer 49 between the source sided face of the gate electrode 48 and the source 50 of the first lateral FET 22. The second lateral FET 23 also has a larger lateral distance between the drain sided edge of the gate electrode 58 and the drain region 61 compared to the distance and thickness of the electrically insulating layer 59 between the source sided face of the gate electrode 58 and the source 60.

In this embodiment, the form of the lightly doped drift region 52 of the first lateral FET 22 and the lightly doped drift region 56 of the second lateral FET 23 differs from that illustrated in FIG. 3. In this embodiment, in the first lateral FET 22, the lightly doped drift region 52 extends from the front surface 31 into the well 44 of the second conductivity type laterally adjacent and contacting the drain region 51 which is more highly doped. The lightly doped drift region then extends under the drain region 51 and under the drain sided edge of the gate trench 45. The lightly doped drift region 53 that extends from the source region 50 has a different arrangement compared to the lightly doped drift region 52 extending from the drain region 51 in that it extends only under the source region 50 and extends under the source sided edge of the first gate trench 45 similar to that shown in FIG. 3.

The second lateral FET 23 also has a similar arrangement of the lightly doped drift region 56 in that it extends from the first surface 31 adjacent and in contact with the drain contact drain region 61 and then under the drain region 61 to the under the drain sided edge of the second gate trench 55. The lightly doped drift region 56 for the source region 60 has the same arrangement as that illustrated in FIG. 3 and extends only under the source region 60 and under the base of the source sided peripheral region of the second gate trench 55.

FIG. 4C illustrates a cross-sectional view of the first and second areas 71, 72 of the semiconductor substrate 20 in which the first and second lateral FETs 22, 23, respectively, according to another embodiment, are positioned. The semiconductor substrate 20 include an epitaxial layer 82 of the first conductivity type which forms the drift region 40 of the vertical power FET 21 and in which the first lateral FET 22, second lateral FET 23 are formed. In this embodiment, the source region 50 of the first lateral FET 22 extends from the first surface 31 into the semiconductor substrate 20 and under the source sided edge of the first gate trench 45. The source region 50 has an L-shape in plan view and may form the sidewall 47 and a portion of the base 46 of the first gate electrode 45. The source region 50 is highly doped with the first conductivity type also in the lateral region which extends under the base 46 of the first gate trench 45. The drain region 51 has a similar L-shape in the cross-sectional view and extends from the first surface 31 into the semi-conductor substrate 20 and under the peripheral region of the first gate electrode 48 and a gate trench 45. The drain region 51 including the lateral portion which forms the is heavily doped with the first conductivity type.

The second lateral FET 23 has a corresponding arrange-ment of the source region 60 and drain region 61. The source region 60 of the first lateral FET extends from the first surface 31 into the semiconductor substrate 20 and under the source sided edge of the first gate trench 55. The source region 60 has an L-shape in cross-sectional view and may form the sidewall 57 and a portion of the base 56 of the first gate trench 55. The source region 60 is highly doped with the first conductivity type also in the lateral region which extends under the base 56 of the second gate trench 55. The drain region 61 has a similar L-shape in the cross-sectional view and extends from the first surface 31 into the semi-conductor substrate 20 and under the peripheral region of the gate trench 55. The drain region 61 including the lateral portion under the gate trench 55 is heavily doped with the first conductivity type.

This arrangement may be used for a lateral DMOS device with a lower voltage rating, for example 3.3 V, whereas the embodiment illustrated in FIG. 4B may be used for lateral DMOS of 12V.

Figure 5A:
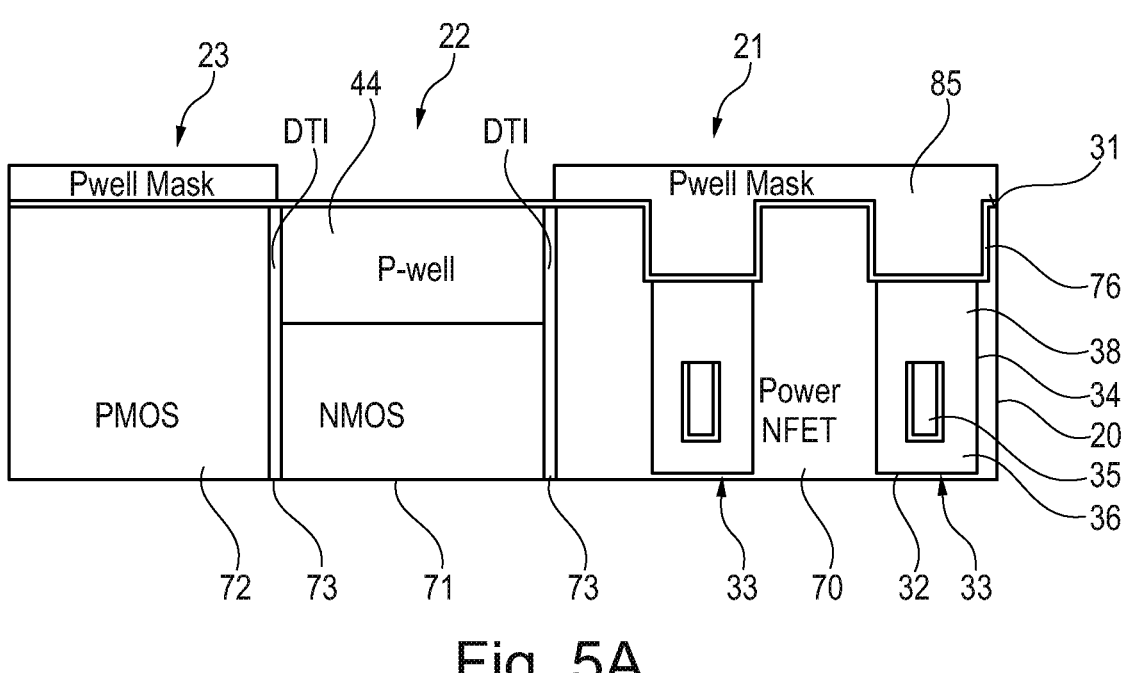
FIGS. 5A to 5Q illustrate a method of fabricating a semiconductor device with a vertical power FET and two lateral FETS monolithically integrated into a common semiconductor substrate.
Figure 5B:
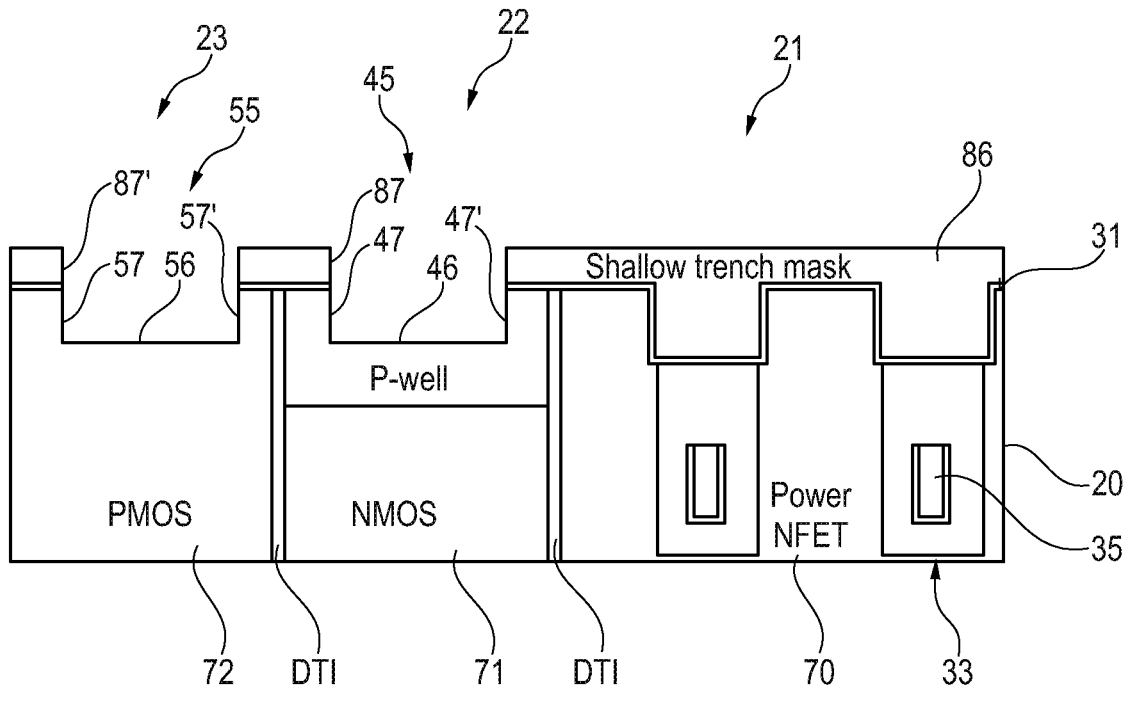
Figure 5C:
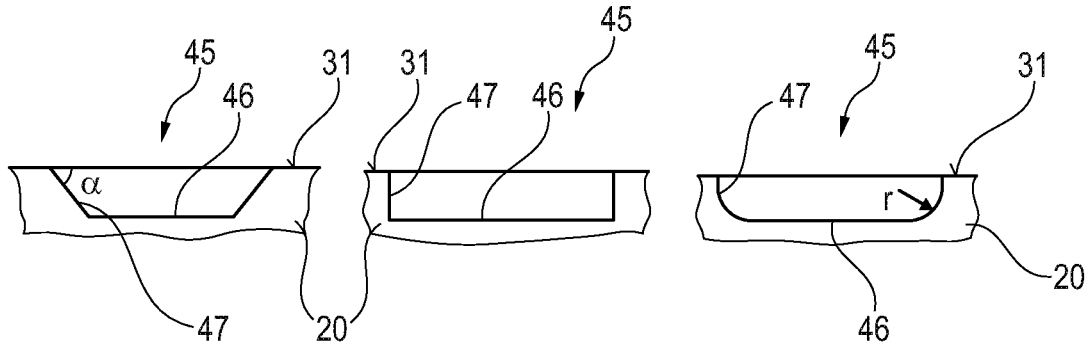
Figure 5D:
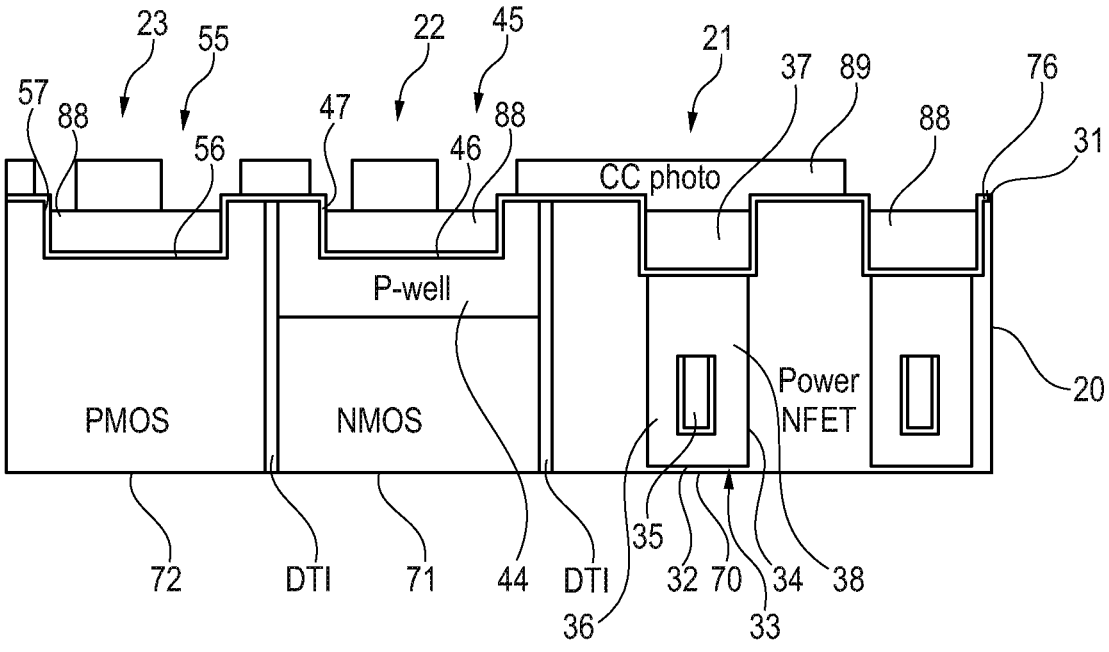
Figure 5E:
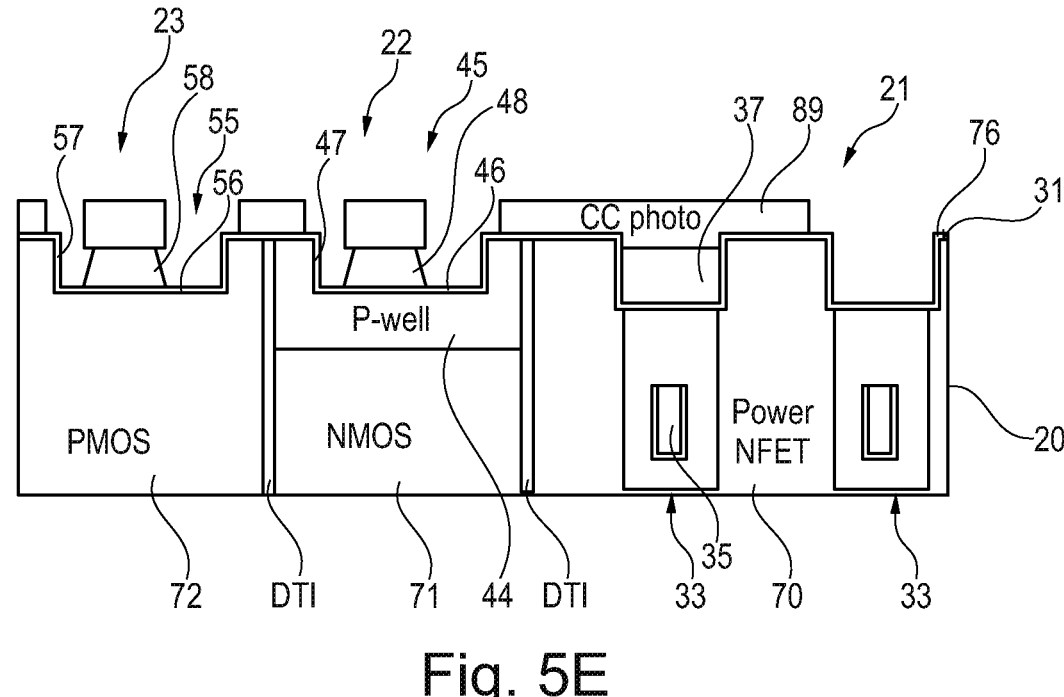
Figure 5F:
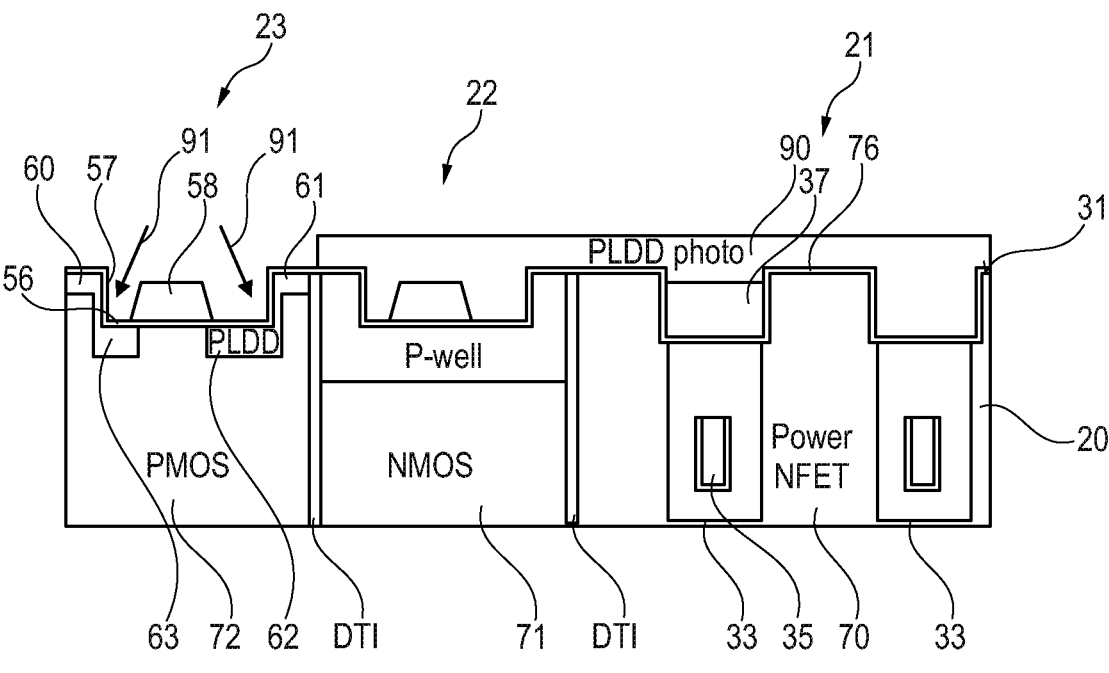
Figure 5G:
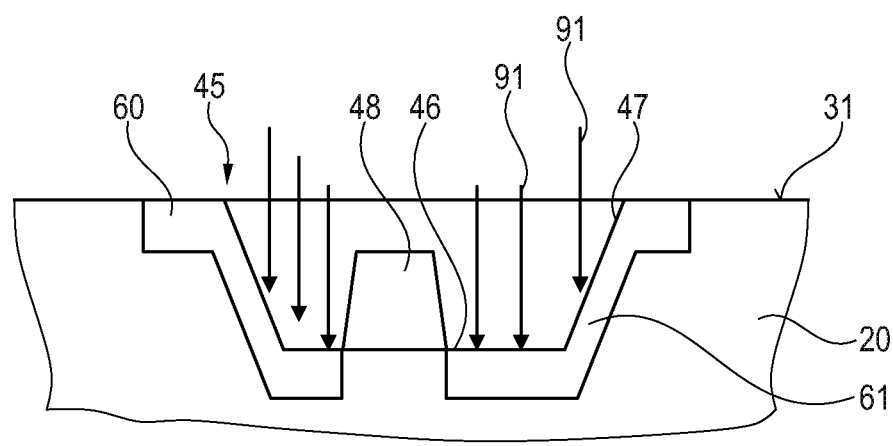
Figure 5H:
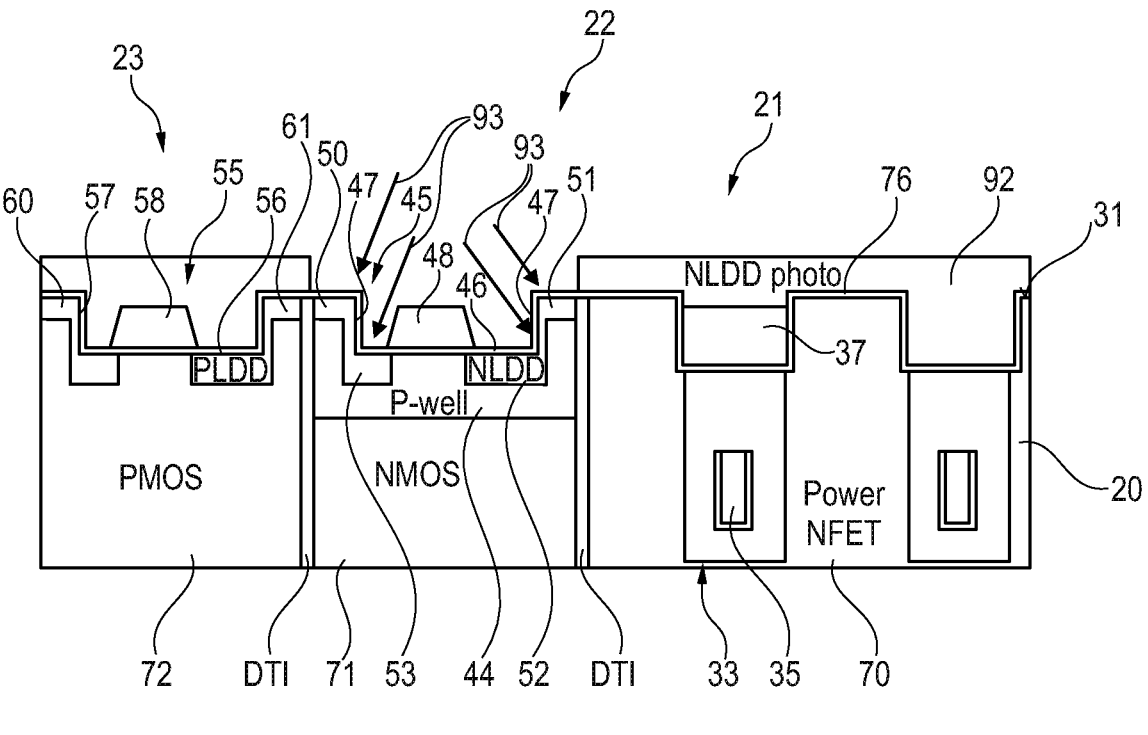
Figure 5I:
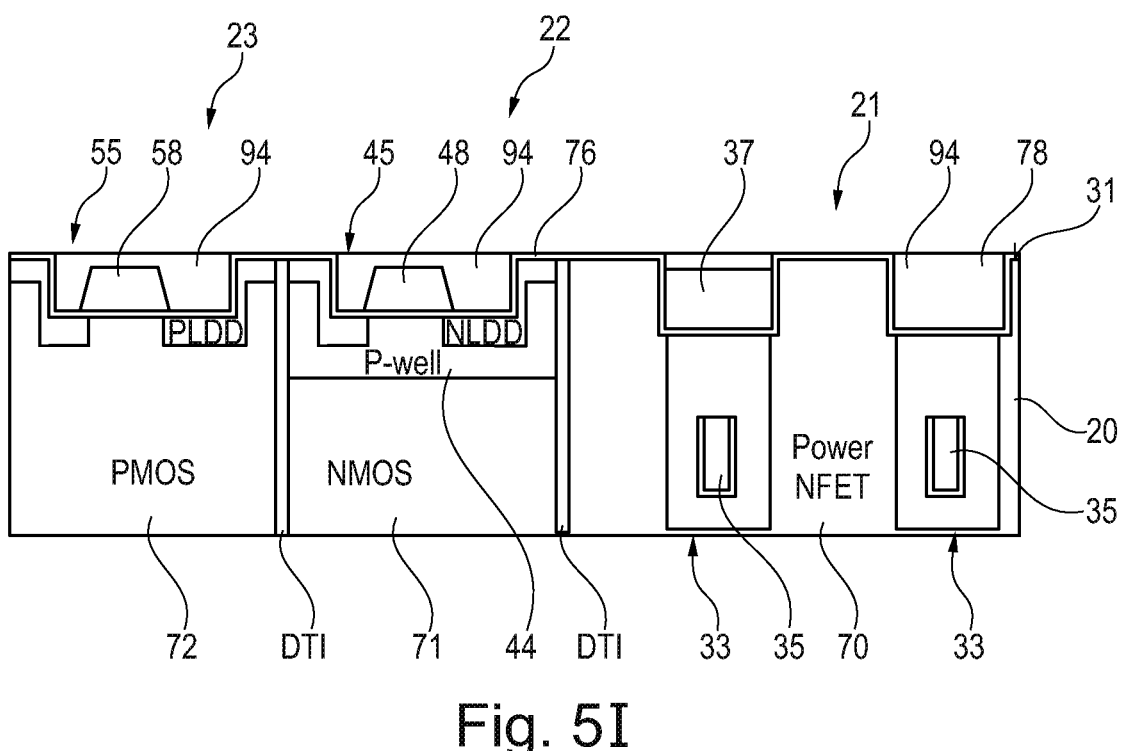
Figure 5J:
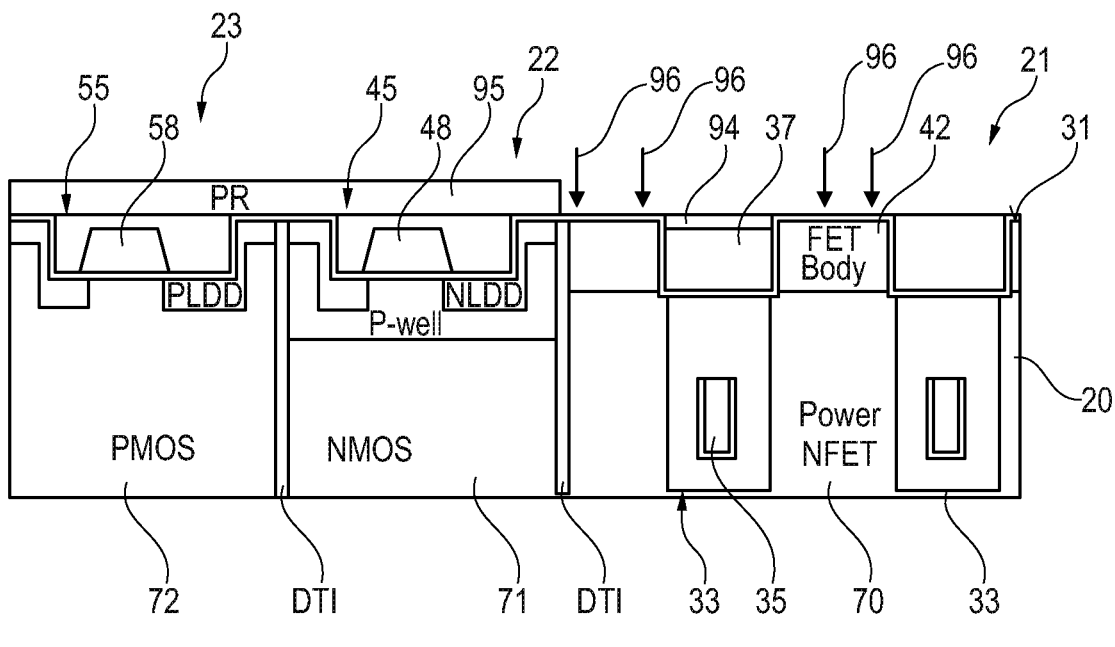
Figures 5K, 5L:
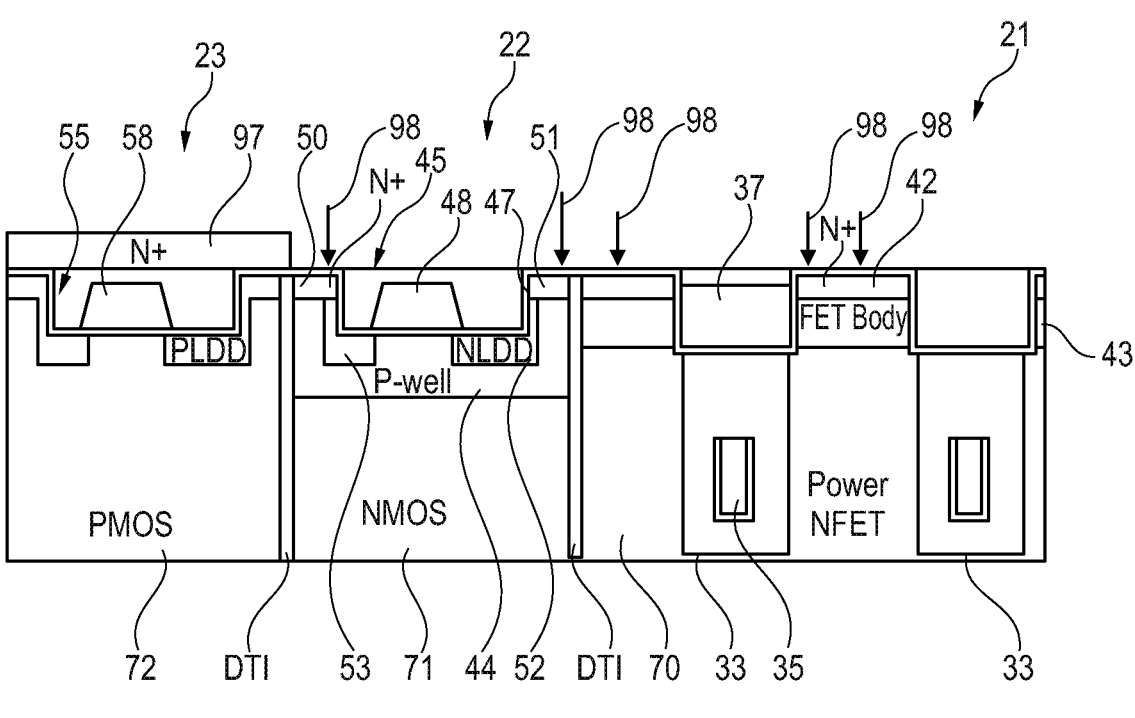
Figure 5M:
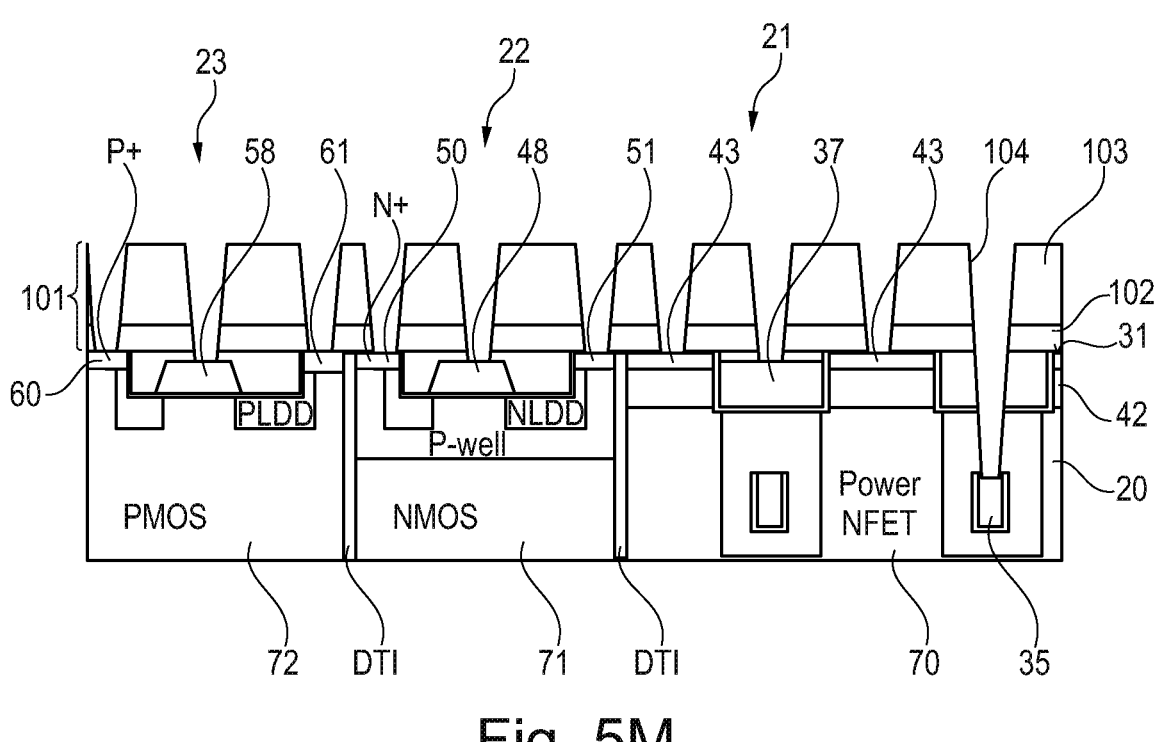
Figure 5N:
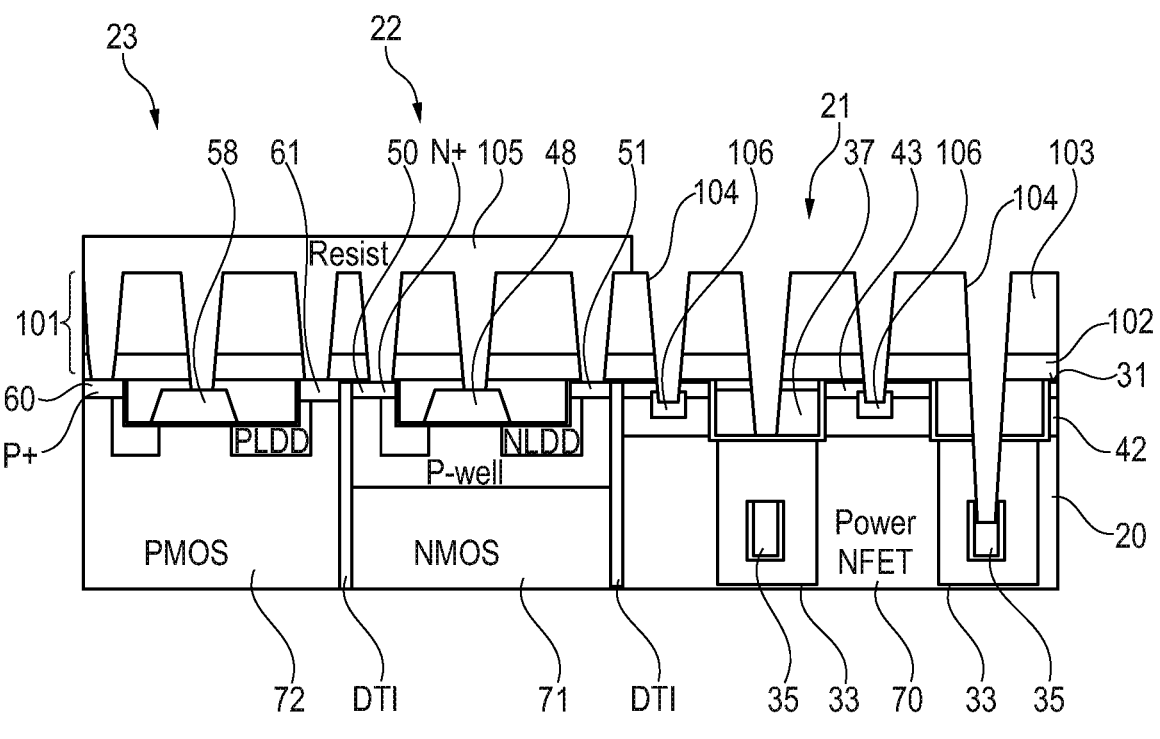
Figure 5O:
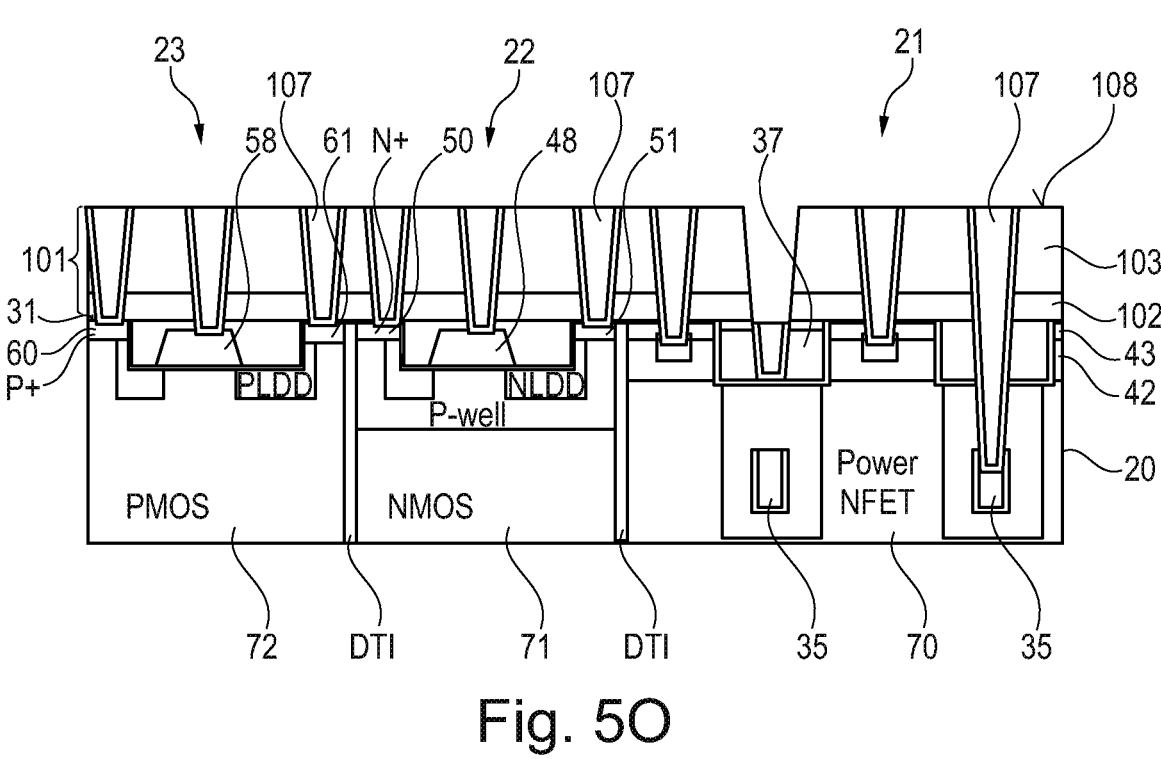
Figure 5P:
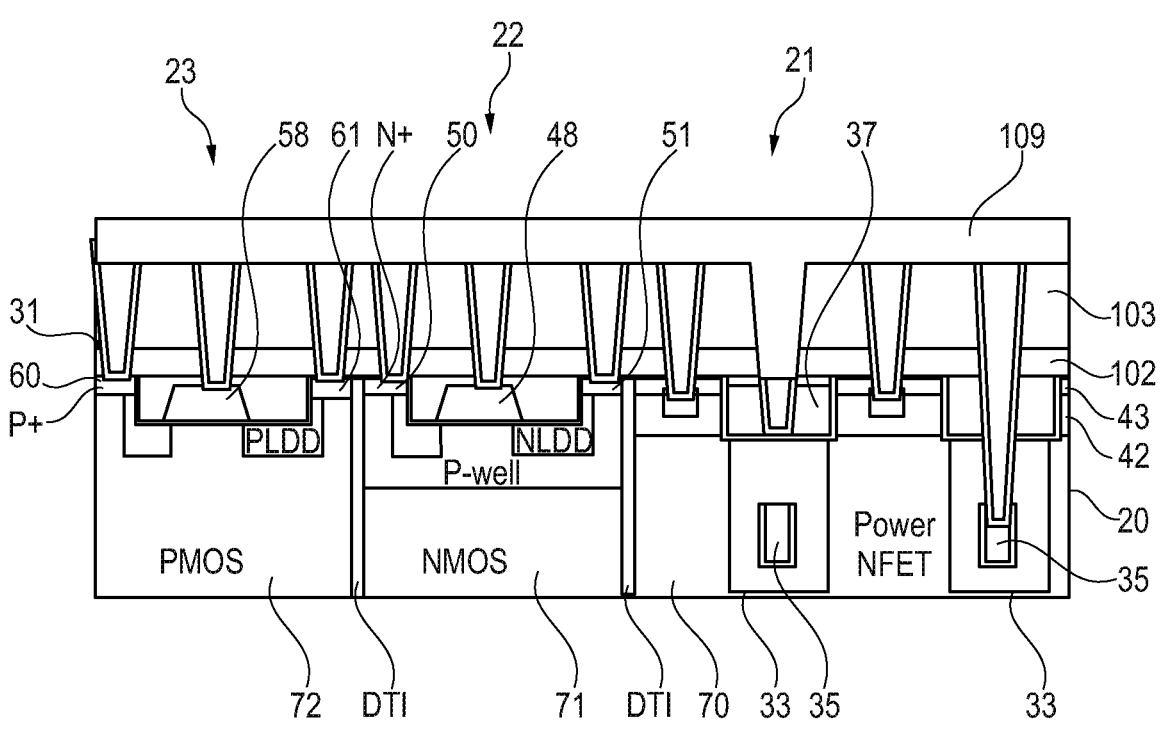
Figure 5Q:
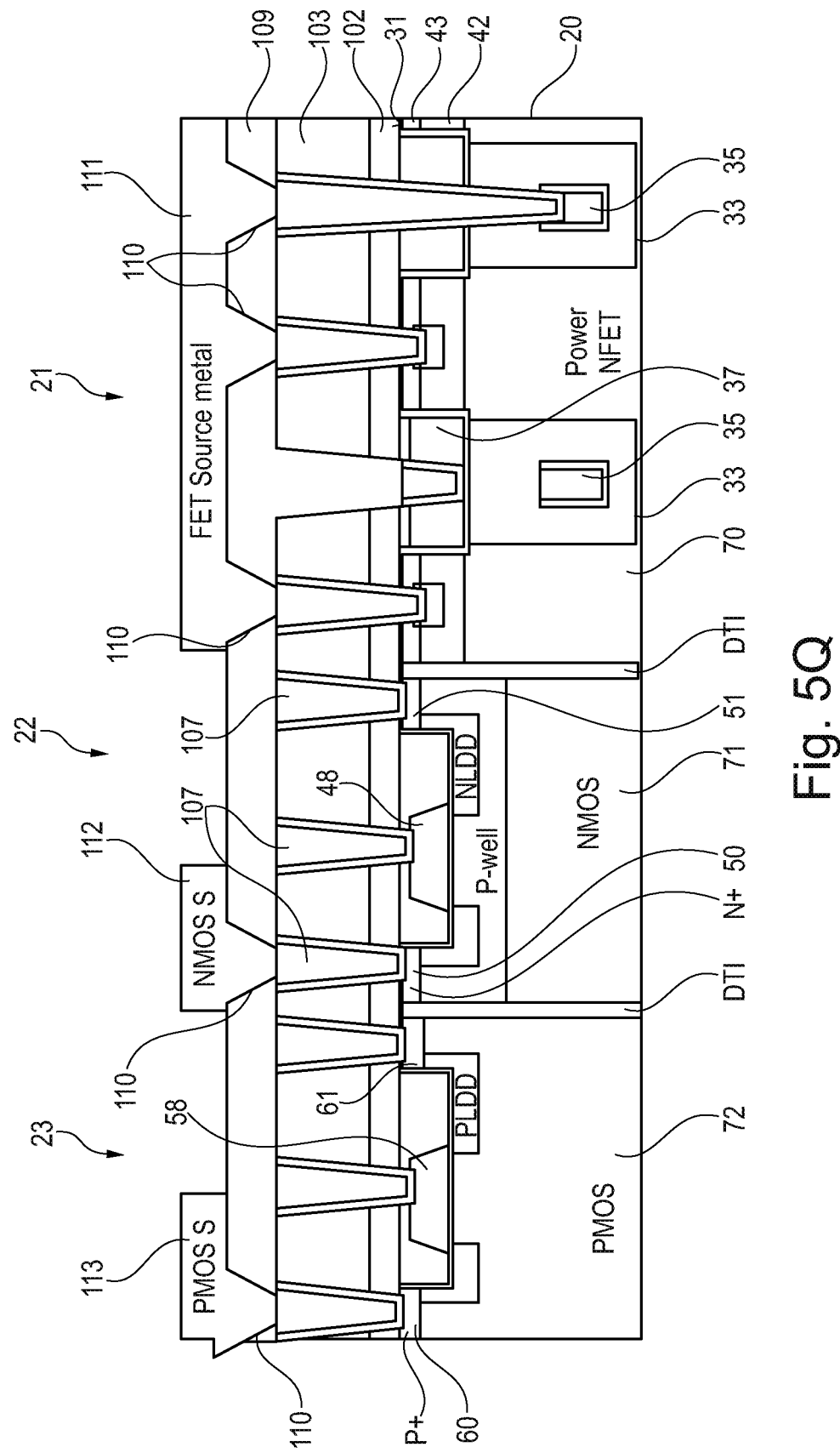

FIGS. 5A to 5Q illustrate a method for fabricating a semiconductor device with a vertical power FET for switch-ing a load current and first and second lateral FETs which provide an output stage of gate driver circuitry for driving the vertical power FET 21. The three transistor devices are arranged in a common semiconductor substrate. The method may be used to fabricate the semiconductor device accord-ing to embodiments described with reference to FIGS. 1 to 4A-4C and will be described with reference to the vertical transistor device 21 and lateral FETs 22, 23.

The semiconductor substrate 20 has a first predefined region 71 for forming a first lateral FET 22 having a channel region of the first conductivity type, a second predefined region 72 for forming the second lateral FET having a channel region of the second conductivity type and a third predefined region 70 in which the vertical power FET 21 is to be formed. The three predefined regions 70, 71, 72 are arranged laterally adjacent one another. Typically, the area of the third predefined region 70 for the vertical power FET is larger than the first and second predefined regions for the two lateral FETs 22, 23.

The semiconductor substrate 20 includes a plurality of trenches 33 for the vertical power FET 21 which are positioned in the third predefined area 70 and which extend into the semiconductor substrate 20 from the first surface 31. The trenches 33 may be elongate with the length extending into the plane of the drawing or columnar and have a height that is greater than, for example at least twice the width and breadth. The trenches 33 are lined with the first electrically insulating material 36 and comprise the field plate 35 in the bottom of the trench 33. The field plate 35 is covered by the intermediate electrically insulating layer 38. The first sur-face 31 of the semiconductor substrate 20 and the sidewalls 34 of the trenches 33 are covered by the first electrically insulating sublayer 76 which may be silicon oxide which has been formed by oxidation. The first electrically conductive sublayer 76 also extends throughout the first and second predefined area 71, 72. The first and second predefined areas 71, 72 are already electrically isolated from the semicon-ductor substrate 20 by isolation trenches 73 and lateral isolation which cannot be seen in the cross-sectional views of FIGS. 5A to 5Q.

Referring to FIG. 5A, a first mask 85 is applied to the first surface 31 which covers the second predefined area 72 and the third predefined area 70 and may also fill the upper portions of the trenches 33 in which the gate electrode 37 is to be formed. The first predefined area 71 is exposed from the mask 85. Dopants of the second conductivity type, for example p-type if the semiconductor substrate 20 is n-type, are implanted into the first surface 31 in the first predefined area 71 to form the well 44. The well 44 has a base that forms a pn junction with the semiconductor substrate 20. In some embodiments, the well 44 extends throughout the first predefined area and extends between the isolation trenches 73.

Referring to FIG. 5B, the first mask 85 is removed and a second mask 86 is applied to the first surface 31. The second mask 86 has a first opening 87 positioned above the first predefined area 71 and a second opening 87' positioned over the second predefined area 72, each opening 87, 87' has an area that is suitable for forming the first gate electrode trench 45 and second gate electrode trench 55, respectively, of the lateral FETs 22, 23. The first gate electrode trench 45 and the second gate electrode trench 55 are formed by removing portions of the semiconductor material, for example by etching. The first and second gate trenches 45, 55 have a depth which is much less than the depth of the trenches 33 of the vertical power FET 21 and may be referred to as shallow trenches. The base of the first gate trench 45 is positioned within the well 44.

In some embodiments, such as that illustrated in FIG. 5B, the sidewalls 47, 57 of the respective gate trench 45, 55 extend substantially perpendicularly to the first surface 31. In other embodiments, the shape of the first and second gate trenches 45, 55 may differ.

FIG. 5C illustrates an embodiment in which the cross-sectional shape of the first and second gate trench 45, 55 is tapered such that the sidewalls 47, 57 extend at an angle $\alpha$ to the first surface 31 which is less than 90° and provide a tapered trench which has a base 46 with a smaller area than the opening at the first surface 31. In some embodiments, the edge between the sidewall 47 and the base 46 is rounded and has a radius r. The sidewall 47 may extend substantially perpendicularly to the first surface 31 or at an inclines angle of less than 90°.

Referring to FIG. 5D, the second mask 86 is removed and the exposed surfaces of the semiconductor substrate 20 are oxidized to form the first electrically insulating sublayer 76 which extends over the front surface 31 and over the sidewalls 47, 47' and base 46 of the first gate electrode trench 45, the side walls 57, 57' and base 56 of the second gate trench 55 and also on the upper portions of the sidewalls 34 of the trenches 33 for the vertical power FET 21. Conductive material 88 is deposited which fills the upper portions of the trenches 33 of the vertical power FET and the first and second gate electrode trenches 45, 55. A portion of the conductive material may be removed or the conductive material 88 applied such that the upper surface of the gate electrode 48, 58 is positioned below the first surface 31.

The method then continues by structuring the conductive material 88 which is positioned in the first and second gate trenches 44, 45 in order to produce a gate electrode 48, 58 of the desired length. A third mask 89 is applied which covers portions of the conductive material 88 in the first and second gate trenches 45, 55, the conductive material 88 forming the gate electrode 35 in the trenches 33 as well as portions of the first surface 31 positioned between the gate trenches 45, 55 and the trenches 33. Peripheral regions of the two gate trenches 45, 55 and a portion of the first trenches 33 of the vertical power FET remain uncovered by the third mask 89. A contact can be made to the field plate 35 positioned in the lower portion of the trench 33 at this portion of the trench 33 that is uncovered by the third mask 33.

Referring to FIG. 5E, the regions of the conductive material 88 which are exposed from the third mask 89 are removed, for example by wet chemical etching. The conductive material 88 in one region of the trenches 33' is completely removed and the peripheral regions of the conductive material 88 in the first and second gate trenches 45, 55 is removed. In some embodiments, there is an under etching effect such that the remaining portion of the conductive material 88, which forms the first and second gate electrode 48, 58 of the first and second lateral FETs 22, 23, has a tapered form such that the base of the gate electrode 48, 58 which is positioned on the base 46, 56 of the first and second lead trench 45, 55, respectively, has an area that is greater than the area of the upper surface which adjoins the third mask 89.

The distance between the drain sided edge of the gate electrode 48 and the sidewall 47' of the trench 45 which is to form the drain region 51 is typically larger than the spacing between the source sided edge of the gate electrode 48 and the sidewall 47 of the trench 45 which is to form the source region 50. These unoccupied regions of the trench 45 will be later filled by electrically insulating material which is often referred to a spacer.

Referring to FIG. 5F, the third mask 89 is then removed and a fourth mask 90 is applied which covers the first predefined area 71 and the third predefined area 70 and leaves the second predefined area 72 exposed. Dopants of the second conductivity type are implanted into the opposing sidewalls 57 of the second gate electrode trench 55 as is shown schematically in FIG. 5F by the arrows 91. The gate electrode 58 acts as a mask such that the region of the semiconductor substrate 20 positioned underneath the gate electrode 58 remains of the first conductivity type. These doped regions of the second conductivity type formed at opposing side walls 57 of the gate electrode trench 55 form the source region 60 and drain region 61, respectively, of the second lateral FET 23. The doped region of the second conductivity type that is formed by the implantation may also be positioned directly adjacent the first surface 31 and extend laterally under the opposing peripheral edges of the gate electrode 58, particularly after a subsequent driving heat treatment. The lateral spacing between the doped regions 62, 63 provides the channel length of the lateral FET 23.

FIG. 5G illustrates an embodiment in which the gate electrode trench 45 has a tapered form such that the side faces 58 of the 57 of the second gate electrode for trench 55 are inclined to the first surface 31 of the semiconductor substrate 20 such that the base 56 of the gate electrode trench 55 has a smaller area than the opening at the first surface 31. This inclined arrangement of the sidewalls 57 assists in the formation of the source region 60 and drain region 61 since implantation can be carried out substantially perpendicularly to the first surface 31 rather than at an inclined angle as is indicated by the arrows 91 in FIGS. 5F and 5G.

Referring to FIG. 5H, the fourth mask 90 is removed and a fifth mask 92 is applied which covers the third predefined area 70 for the power vertical FET 21 and the second predefined area 72 for the second lateral FET 23 and which leaves the first predefined lateral area 71 for the first lateral FET 22 exposed. As shown schematically by the arrows 93 in FIG. 5H, dopants of the first conductivity type are implanted into the sidewalls 47 of the trench 45 and into the peripheral regions of the base 46 which are uncovered by the gate electrode 48 so as to form a source region 50 and drain region 51 of the first conductivity type at the two opposing sidewalls 47, 47' of the first gate electrode trench 45 and the laterally diffused drift regions 52, 53 positioned under the base 46 of the gate electrode trench 45.

Referring to FIG. 5I, after removing the fifth mask 92 an electrically insulating layer material 94 is applied that fills the first and second gate electrode trenches 45, 55 covering the gate electrodes 48, 58 and also covers the top surface of the gate electrode 37 formed in the trench 33 of the vertical power FET 21. The electrically insulating layer 94 also fills the cavity formed in the trench 33 where the contact to the field plate 35 is to be formed. The electrically insulating layer 94 may provide the second insulating sublayer 78 shown in FIG. 4A. A planarisation process may be used after applying the insulating material 94.

Referring to FIG. 5J, a sixth mask 95 is applied which covers the first and second predefined area 71, 72 and which leaves the third predefined area 70 exposed. Dopants of the second conductivity type are implanted into the first surface 31, as is indicated schematically by the arrows 96, to form the body region 42 of the vertical power FET 21.

Referring to FIG. 5K, the sixth mask 95 is removed and a seventh mask 97 is applied which covers only the second predefined area 72 and which leaves the first predefined area 71 and the third predefined area 70 uncovered. Dopants of the first conductivity type are implanted into the first surface 31 in the first and third predefined areas 71, 70, as is indicated schematically by the arrows 98, to form the source region 43 on the body region 42 in the third predefined area 70 and to form the source region 50 and the drain region 51 on opposing sides of the first gate electrode trench 45 of the first lateral FET 22.

Referring to FIG. 5L, the seventh mask 97 is removed and an eighth mask 99 is applied which covers the first and third predefined areas 71, 70 and which leaves the second predefined area 72 exposed. Dopants of the second conductivity type are implanted as indicated schematically by the arrows 100 into the first surface 31 in the second predefined area to form the source region 60 and drain region 61 on opposing sides 57 of the second gate electrode trench 55.

Referring to FIG. 5M, the eighth mask 99 is then removed and a third insulating layer 101 applied to the first surface 31 which covers the first, second and third predefined areas 71, 72, 73. The third insulating layer 101 may comprise two or more sublayers 102, 103. A plurality of openings 104 are formed in the third insulating layer 101 which are positioned so as to form a contact to the source region 51, drain region 52 and gate electrode 48 of the first lateral FET 22, the source region 61, drain region 62 and gate electrode 58 of the second lateral FET 23 and the gate electrode 37 and source and body regions 42, 43 of the vertical power FET 21 which are positioned in the mesas 40. An opening 104 may also be formed which extends to the field plate 35 in the bottom of the trench 33.

Referring to FIG. 5N, in some embodiments, a ninth mask 105 is applied to the first and second predefined areas 71, 72 which leaves the third predefined area 70 uncovered. Portions of the source region 43 and body region 42 at the base of the openings 104 are removed and dopants of the second conductivity type are inserted into the base of the extended opening to form a contact region 106 in the semiconductor substrate 20 which is more highly doped than the body region 42. Similarly, the opening to the gate electrode 37 may be extended such that it extends into and, is some embodiments through the thickness of, the gate electrode 37. A portion of the upper surface of the exposed region of the field plate 35 is also removed.

Referring to FIG. 5O, the ninth mask 105 is removed and conductive material 107 is inserted into the openings 103. The conductive material may comprise tungsten and, in some embodiments, comprises two or more sublayers, for example titanium, titanium nitride and tungsten. The surface may then be planarised to produce a planarised surface 108 comprising conductive material 107 forming contacts through the third electrically insulating layer 101 to the underlying structures.

The fabrication of the metallisation structure on the first surface 31 may continue by removing some of the conductive material 107 from portions of the contacts which are to be electrically insulated from an overlying electrically conductive layer. FIG. 5P shows a cross-sectional view in which a portion of the conductive material for a contact to the gate electrode 37 of the vertical power FET 21 has been removed and an electrically insulating layer 109 has been applied onto the planarized surface 108 in the first, second and third areas, 70, 71, 72. The electrically insulating layer 109 may be an oxide such as a silicon oxide.

In FIGS. 5A to 5Q, the method is illustrated with reference to a single transistor cell of the first lateral FET 21 including the source region 50, drain region 51 and the first gate electrode 48, a single cell of the second lateral FET 23 including the source region 60, drain region 61 and the first gate electrode 6 and two transistor cells of the vertical power FET each including a mesa 41 and a trench 33 with the gate electrode 37 and field plate 35. However, in practice each of the device includes a plurality of transistor cells, each having the illustrated structure.

Referring to FIG. 5Q, openings 110 may be formed in the fourth electrically insulating layer 109 which exposes the contacts to the source regions of the three devices. A first source bus 111 may be formed which is electrically connected to the source regions 42 and the field plate 37 of the vertical power FET 21. A second source bus 112 is formed which is electrically connected to the source region 50 of the first lateral FET 22. A third source bus 113 is formed which is electrically connected to the source region 61 of the second lateral FET 23. In other positions of the first surface 31 which are positioned behind or in front of the plane of the cross-sectional view of FIG. 5Q, buses may be formed for the drain regions and gate electrodes of the three transistor devices.

Figure 6:
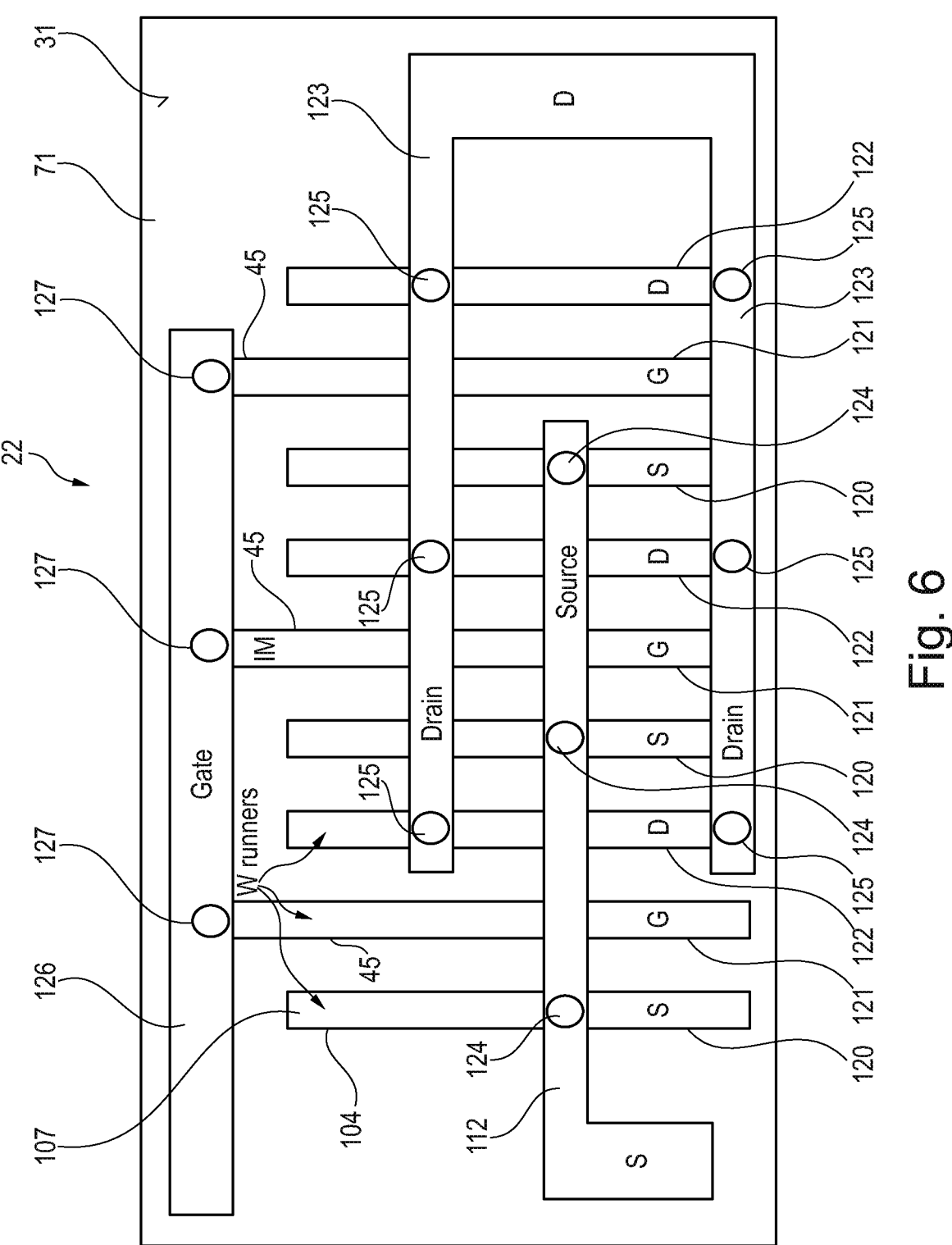
FIG. 6 illustrates a top view of the metallization structure of a lateral FET.

FIG. 6 illustrates a top view of an example of the redistribution structure that may be used for one or both of the lateral FETs 22, 23 but will be described with reference to the first lateral FET 22. A plurality of transistor cells are shown that are arranged laterally adjacent to one another. As can be seen in the top view, the contacts 108 formed in the openings 104 have an elongate structure in plan view, with the first lateral FET 22 including a plurality of source, gate and drain runners 120, 121, 122 extending substantially parallel to one another. The source metal bus 112 extends substantially perpendicularly to the length of the runners 120, 121, 123 such that a plurality of the source regions 50 are electrically connected to the source metal bus 112 by one or more contacts 124 formed by the exposed region of the conductive material 106 forming the source runners 120 and, therefore, also to one another by way of the source bus 111.

Similarly, a drain metal bus 123 extends substantially parallel to the length of the runners 120, 121, 122 and includes a contact 125 through the insulating layer 109 to each of the drain regions 51. The drain buses 123 and source buses 112 may be arranged alternately along the length of the runners 120, 121. In embodiments in which more than one bus is provided for either the drain connection or the source connection, these are electrically connected together by a connection section 125 that extends parallel to the runners 120, 121, 122.

In this example, the gate metal bus 126 is arranged at one distal end of the gate trenches 45 and electrically connected to them by a contact 127 formed by the conductive material 107 in the openings 110 in the insulating layer 109.

The electrically insulating layer 109 is positioned between the underlying runners 120, 121, 122 and the overlying busses 111, 123, 126 at positions outside of the contacts to the runners 120, 121, 122 and electrically insulates the busses 111, 123, 126 from the runners 120, 212, 122 in these regions.

The methods described with reference to FIGS. 5A to 5Q enables the lateral FETs 22, 23 to be fabricated using many of the same process steps that are used for fabricating the vertical power FET 21. Thus, the lateral FETs 22, 23 can be more simply monolithically integrated into the semiconductor substrate 20 used for the vertical power MOSFET 21.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a vertical power FET configured to switch a load current and provide a channel region of a first conductivity type; and
   a first lateral FET and a second lateral FET providing an output stage of gate driver circuitry configured to drive the power FET, wherein the first lateral FET is configured to provide a channel region of the first conductivity type and the second lateral FET is configured to provide a channel region of a second conductivity type opposing the first conductivity type;

wherein the power FET and the first and second lateral FETs are monolithically integrated into a semiconductor substrate of the first conductivity type, wherein a drain of the first lateral FET and a source of the second lateral FET are electrically coupled to a gate of the power FET.

2. The semiconductor device of claim 1, wherein a well of the second conductivity type is formed in a first surface of the semiconductor substrate, wherein the first lateral FET is formed in the well and comprises a gate electrode arranged in a first gate trench formed in the first surface, the gate electrode being electrically insulated from the well by a first insulating layer, a source region of the first conductivity type and a drain region of the first conductivity type that are arranged on opposing sides of the gate electrode and in the well.

3. The semiconductor device of claim 2, wherein the first lateral FET further comprises a lightly doped drift region of the first conductivity type that extends from the drain region under the first gate trench.

4. The semiconductor device of claim 2, wherein the first insulating layer has a thickness on the base of the first gate trench that provides the gate insulation layer for the gate electrode and has a thickness between a side wall of the first gate trench that is formed by the drain region and the gate electrode that is greater than the thickness on the base.

5. The semiconductor device of claim 2, wherein:

the first gate trench has a base and side walls, wherein the side walls extend substantially perpendicular to the first surface or are inclined to the first surface to form a tapered trench, and/or an edge between the base and the side walls is rounded.

6. The semiconductor device of claim 1, wherein the second lateral FET is formed in the semiconductor substrate and comprises a gate electrode arranged in a second gate trench formed in the first surface of the semiconductor substrate, the gate electrode being electrically insulated from the semiconductor substrate by a second insulating layer, a source region of the second conductivity type and a drain region of the second conductivity type that are arranged on opposing sides of the gate electrode.

7. The semiconductor device of claim 6, wherein the second lateral FET further comprises a lightly doped drift region of the second conductivity type that extends from the drain region under the second gate trench.

8. The semiconductor device of claim 6, wherein the second insulating layer has a thickness on the base of the second gate trench that provides the gate insulation layer for the gate electrode and has a thickness between the side wall of the second gate trench that is formed by the drain region and the gate electrode that is greater than the thickness on the base.

9. The semiconductor device of claim 1, wherein the power FET comprises a plurality of third trenches extending into the semiconductor substrate from the first surface, wherein the semiconductor substrate provides the drift region of the vertical power FET, wherein each third trench comprises a field plate that is electrically insulated from the semiconductor substrate, wherein the power FET further comprises a drain region arranged at a second surface of the semiconductor substrate opposing the first surface, a body region of the second conductivity type arranged on the drift region and a source region of the first conductivity type arranged on the body region.

10. The semiconductor device of claim 9, wherein each of the plurality of third trenches further comprises a gate electrode arranged above and electrically insulated from the field plate.

11. The semiconductor device of claim 9, wherein the power FET further comprises a plurality of gate trenches comprising a gate electrode, one gate trench being arranged between adjacent ones of the plurality of third trenches.

12. The semiconductor device of claim 10, wherein the third trenches are columnar or elongate.

13. A method for forming a vertical power FET for switching a load current, a first lateral FET and a second lateral FET in a common semiconductor substrate, the method comprising:

providing a semiconductor substrate of a first conductivity type, the semiconductor substrate comprising:

a first surface, a plurality of trenches for a vertical power FET in the first surface, each comprising a field plate that is electrically insulted from the semiconductor substrate, a first predefined region for a first lateral FET comprising a channel region of the first conductivity type, and a second predefined region for a second lateral FET comprising a channel region of a second conductivity type opposing the first conductivity type;

forming a well of the second conductive type in the first surface of the semiconductor substrate in the first predefined region;

forming a first gate trench in the first surface of the semiconductor substrate for a first gate electrode in the first predefined region and forming a second gate trench in the first surface of the semiconductor substrate for a second gate electrode in the second predefined region;

forming a gate insulating layer that covers the side walls and base of the first and second gate trenches, the first surface of the semiconductor substrate and the upper portion of the plurality of trenches;

inserting conductive material into the first and second gate trenches and in the plurality of trenches to form a third gate electrode in the plurality of trenches;

removing conductive material from the first and second gate trenches in regions adjacent the side walls and peripheral regions of the base and exposing the gate insulating layer on the side walls and the peripheral regions of the base and forming a first gate electrode having a pre-determined length from the conductive material in the first gate trench and a second gate electrode having a pre-determined length from the conductive material in the second gate trench;

in the second predefined area, implanting dopants of the second conductivity type into the side walls and the peripheral regions of the base of the second gate trench;

in the first predefined area, implanting dopants of the first conductivity type into the side walls and peripheral regions of the base of the first gate trench; and forming insulating material in the first and second gate trenches and on the third gate electrodes in the plurality of trenches.

14. The method of claim 13, further comprising:

implanting dopants of the second conductivity type into the first surface of the semiconductor substrate to form a body region of the power FET;

implanting dopants of the first conductivity type into the first surface of the semiconductor substrate and into the well of the second conductivity type in the first pre-defined region to form source and drain regions of the first lateral FET and a source region on the body region for the vertical power FET;

implanting dopants of the second conductivity type into the first surface of the semiconductor in the second predefined region to form source and drain regions of the second lateral FET;

forming a third insulating layer on the first surface, forming openings in the third insulating layer and forming an opening to the first gate electrode in the first gate trench, to the source region and to drain region of the first lateral FET, to the second gate electrode in the second gate trench, to the source region and to drain region of the second lateral FET, to the third gate electrodes in the plurality of trenches and to the source region of the vertical power FET;

inserting conductive material into the openings and pla-narising to form a planarized surface comprising con-tacts formed of the conductive material arranged in the openings and the third insulating layer; and forming a metallization structure on the planarized sur-face.

15. The method of claim 13, wherein removing the conductive material from the first and second gate trenches comprises:

applying a mask onto the first surface that covers the third gate electrodes in the plurality of trenches and that covers designated source and drain regions on opposing sides of the first and second gate trenches and a designated gate electrode region of the conductive material in the first and second gate trenches;

removing the exposed regions of the conductive material from the first and second gate trenches by etching, wherein the first gate electrode has inclined side walls, wherein a base of the first gate electrode that is formed on the gate insulating layer has a larger area than a top of the first gate electrode and wherein the second gate electrode has inclined side walls, wherein a base of the second gate electrode that is formed on the gate insu-lating layer has a larger area than a top of the second gate electrode.

16. The semiconductor device of claim 6, wherein the second gate trench has a base and side walls, wherein the side walls extend substantially perpendicular to the first surface or are inclined to the first surface to form a tapered trench, and/or an edge between the base and the side walls is rounded.

* * * * *